US012588465B2

(12) United States Patent (10) Patent No.: US 12,588,465 B2
Mitsuyoshi (45) Date of Patent: Mar. 24, 2026

(54) SUBSTRATE TREATING APPARATUS

(71) Applicant: SCREEN Holdings Co., Ltd., Kyoto (JP)

(72) Inventor: Ichiro Mitsuyoshi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 139 days.

(21) Appl. No.: 18/472,869

(22) Filed: Sep. 22, 2023

(65) Prior Publication Data

US 2024/0105484 A1 Mar. 28, 2024

(30) Foreign Application Priority Data

Sep. 22, 2022 (JP) ................................. 2022-151709

(51) Int. Cl.
H01L 21/677 (2006.01)
H01L 21/67 (2006.01)
(Continued)

(52) U.S. Cl.
CPC .. H01L 21/67718 (2013.01); H01L 21/67057 (2013.01); H01L 21/67303 (2013.01); H01L 21/67313 (2013.01); H01L 21/68735 (2013.01)

(58) Field of Classification Search
CPC ......... H01L 21/67057; H01L 21/67303; H01L 21/67313; H01L 21/67718; H01L 21/68735
See application file for complete search history.

(56) References Cited

U.S. PATENT DOCUMENTS 6,074,515 A 6/2000 Iseki et al. .................... 156/345
2006/0137726 A1* 6/2006 Sano ................. H01L 21/67028
118/696
(Continued)

FOREIGN PATENT DOCUMENTS

JP H05-270660 A 10/1993
JP H10-270524 A 10/1998
(Continued)

OTHER PUBLICATIONS

Notice of Allowance dated Jul. 11, 2024 for corresponding Taiwan Patent Application No. 112135827.
(Continued)

*Primary Examiner* — Saul Rodriguez
*Assistant Examiner* — Brendan P Tighe
(74) *Attorney, Agent, or Firm* — OSTROLENK FABER LLP

(57) ABSTRACT

Disclosed is a substrate treating apparatus provided with a posture turning unit. The posture turning unit includes a first vertical holder having a first rotating member and a first holder body provided so as to protrude from the first rotating member. The posture turning unit also includes a second vertical holder having a second rotating member and a second holder body provided so as to protrude from the second rotating member. A rotation driving unit rotates the two holder bodies around the two rotating members, respectively, whereby the two vertical holders are changed into a holding state or a releasing state. When a posture of substrates is turned to horizontal by a support base rotator, the rotation driving unit changes a state of the two vertical holders into the releasing state, whereby the substrates are released from the two holder bodies.

10 Claims, 18 Drawing Sheets

(51) Int. Cl.
  *H01L 21/673* (2006.01)
  *H01L 21/687* (2006.01)

(56) References Cited

U.S. PATENT DOCUMENTS

| | | | | |
|---|---|---|---|---|
| 2015/0332940 A1* | 11/2015 | Wang | ............... | H01L 21/67781 |
| | | | | 134/25.1 |
| 2018/0090356 A1* | 3/2018 | Miyamoto | ........ | H01L 21/68707 |
| 2018/0090358 A1* | 3/2018 | Miyamoto | ........ | H01L 21/67288 |
| 2018/0090359 A1* | 3/2018 | Miyamoto | ........ | H01L 21/67313 |
| 2018/0090360 A1* | 3/2018 | Miyamoto | ............. | H01L 21/68 |
| 2021/0111038 A1* | 4/2021 | Kanagawa | ........... | H01L 21/561 |
| 2024/0105482 A1* | 3/2024 | Mitsuyoshi | ....... | H01L 21/67023 |
| 2024/0105483 A1* | 3/2024 | Mitsuyoshi | ....... | H01L 21/67757 |
| 2024/0105484 A1* | 3/2024 | Mitsuyoshi | ....... | H01L 21/67718 |
| 2024/0105486 A1* | 3/2024 | Amahisa | .......... | H01L 21/67781 |

FOREIGN PATENT DOCUMENTS

| | | |
|---|---|---|
| JP | 2000-228436 A | 8/2000 |
| JP | 2001-068526 A | 3/2001 |
| JP | 2016-502275 A | 1/2016 |
| JP | 2018-056338 A | 4/2018 |
| JP | 2018-056341 A | 4/2018 |
| JP | 2021-064652 A | 4/2021 |
| KR | 10-2022-0044108 A | 4/2022 |
| TW | 200902415 A | 1/2009 |
| TW | 201020194 A | 6/2010 |
| TW | 201731010 A | 9/2017 |
| TW | 201814812 A | 4/2018 |

OTHER PUBLICATIONS

Office Action dated Dec. 18, 2024 for corresponding Korean Patent Application No. 10-2023-0122911.

Extended European Search Report dated Feb. 22, 2024 for corresponding European Patent Application No. 23198358.6.

Decision of Final Rejection dated Oct. 13, 2025 for corresponding Korean Patent Application No. 10-2023-0122911 and its English translation.

Decision to Grant a Patent dated Feb. 3, 2026 for corresponding Japanese Patent Application No. 2022-151709 and its English translation.

* cited by examiner

W

109

109A                                    109

109A

DEIONIZED WATER

61

107

W

65

109A          109A

109          AX4          109

67

112

69,70

71,72

AR1

W

W

63

W

76

74          AX5

SUBSTRATE TREATING APPARATUS

CROSS-REFERENCE TO RELATED APPLICATIONS

This application claims priority to Japanese Patent Application No. 2022-151709 filed Sep. 22, 2022, the subject matter of which is incorporated herein by reference in entirety.

TECHNICAL FIELD

The present invention relates to a substrate treating apparatus configured to perform treatment on substrates. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

BACKGROUND ART

Examples of currently-used substrate treating apparatus include a substrate treating apparatus of a hybrid type provided with a batch-type processing module (batch processing unit) configured to perform treatment on a plurality of substrates collectively, a single-wafer-type processing module (single-wafer processing unit) configured to perform treatment on the substrates, on which the treatment is performed by the batch-type processing module, one by one, and a rotating mechanism configured to turn a posture of the substrates. See, for example, Japanese Patent Publication (Translation of PCT Application) No. 2016-502275 and Japanese Unexamined Patent Publication No. 2021-064652.

Japanese Unexamined Patent Publication No. 2018-056341 discloses a posture changing mechanism 201 as shown in FIG. 1A. The posture changing mechanism 201 includes a pair of horizontal support members 203, a pair of vertical supporting members 205, a cylindrical edge abutment part 207, a mounting block 209, and a rotation part 211. The pair of horizontal support members 203, the pair of vertical supporting members 205, and the cylindrical edge abutment part 207 are erected on the mounting block 209. The mounting block 209 is rotated by the rotating part 211 around a horizontal axis AX12.

The pair of vertical supporting members 205 are movable in a direction of an arrow AR10, and the edge abutment part 207 is movable in a direction of an arrow AR11. After a posture of substrates W in a vertical posture is turned to horizontal, the edge abutment part 207 is moved from a position illustrated by dotted lines to a position of an edge of the substrates W illustrated by solid lines. Thereafter, the pair of vertical supporting members 205 are moved from the position illustrated by the solid lines to the position illustrated by dotted lines. Accordingly, as shown in FIG. 1B, the pair of vertical supporting members 205 are moved while the edge abutment part 207 contacts the substrates W, thereby releasing gripping of the substrates W by the pair of supporting members 205.

SUMMARY OF INVENTION

Technical Problem

However, it is sometimes desired in the substrate treating apparatus having the construction as above that the pair of (two) vertical supporting members (vertical holders) 205 release holding of the substrates W with no use of the edge abutment part 207.

The present invention has been made regarding the state of the art noted above, and its one object is to provide a substrate treating apparatus that can release holding of substrates with two vertical holders satisfactorily.

Solution to Problem

The present invention is constituted as stated below to achieve the above object. One aspect of the present invention provides a substrate treating apparatus for successively performing batch treatment for processing a plurality of substrates collectively and single-wafer treatment for processing the substrates one by one. The substrate treating apparatus includes a batch process tank configured to process the plurality of substrates collectively, a batch substrate transport mechanism configured to transport the substrates in a vertical posture collectively to the batch process tank, a single-wafer processing chamber configured to perform treatment on the substrates one by one, a horizontal substrate transport mechanism configured to transport the substrates in a horizontal posture one by one to the single-wafer processing chamber, and a posture turning mechanism configured to turn a posture of the substrates, on which the batch treatment is performed, from vertical to horizontal. The posture turning mechanism includes a substrate holder configured to hold the substrates in a vertical posture that are arranged at a predetermined pitch, and a posture turning unit configured to receive the substrates from the substrate holder and turn a posture of the received substrates from vertical to horizontal. The posture turning unit includes two horizontal holders configured to house the substrates by placing thereon when the substrates are in a horizontal posture, two vertical holders configured to hold the substrates, housed by the two horizontal holders, in the vertical posture when the substrates are in a vertical posture, a support base configured to support the two horizontal holders and the two vertical holders, a support base rotator configured to rotate the support base around a horizontal axis, and a state changing unit configured to change a state of the two vertical holders between a holding state where the two vertical holders can hold the substrates and a releasing state where the two vertical holders release the holding state. The two vertical holders are constituted by a first vertical holder and a second vertical holder. The first vertical holder includes a first rotating member extending perpendicular with respect to a support face of the support base, and a first holder body provided so as to protrude from the first rotating member in a direction orthogonal to an extension direction where the first rotating member extends, and the second vertical holder includes a second rotating member extending perpendicular with respect to the support face of the support base, and a second holder body provided so as to protrude from the second rotating member in a direction orthogonal to an extension direction where the second rotating member extends. The first holder body and the second holder body each have a plurality of holding grooves provided along an alignment direction where the substrates are aligned. The state changing unit changes a state of the two vertical holders to either the holding state or the releasing state by causing the first holder body and the second holder body to rotate around the first rotating member and the second rotating member, respectively. When the substrates are to be held, the state changing unit changes the state of the two vertical holders into the holding state, whereby the first holder body and the second holder body grip the substrates, and when a posture of the substrates, held by the two vertical holders, is turned from vertical to horizontal by the support base rotator, the state changing unit changes the state of the two vertical holders into the releasing state, whereby the first holder body and the second holder body release the substrates.

With the substrate treating apparatus according to the aspect of the present invention, when the posture of the substrates, held by the two vertical holders, is turned from vertical to horizontal by the support base rotator, the state changing unit changes the state of the two vertical holders into the releasing state, whereby the first holder body and the second holder body release the substrates. Since the releasing state is brought by rotation of the two holder bodies, a force applied to the substrates when release is made, which may cause positional shift of the substrates, is offset with the two holder bodies. This leads to difficulty in generation of the positional shift of the substrates. Consequently, holding of the substrates with the two vertical holders can be released satisfactorily.

Moreover, in order to bring the two vertical holders into a state of either the holding state or the releasing state, the first holder body and the second holder body rotate individually. Thus, the support base, i.e., the posture turning unit, can be made compact.

Moreover, it is preferred in the substrate treating apparatus described above that the first rotating member and the second rotating member are arranged by a width smaller than a diameter of each of the substrates. Even when the positions of the substrates are shifted when the two holder bodies each having a plurality of holding grooves rotate for being brought into the releasing state, the first rotating member and the second rotating member serve as a stopper. This can prevent further positional shift of the substrates.

Moreover, it is preferred that the substrate treating apparatus described above further includes a lateral rotator configured to rotate the substrate holder around a vertical axis. This can change orientation of front and back faces of the substrates appropriately.

Moreover, it is preferred in the substrate treating apparatus described above that the first holder body and the second holder body each further include a plurality of passing grooves provided in the alignment direction of the substrates and configured to pass the substrates one by one, that the holding grooves and the passing grooves are arranged alternately for holding a first divided substrate group of the substrates, made by taking every other substrate out of the substrates, with the holding grooves, and that the posture turning unit receives the first divided substrate group of the substrates from the substrate holder, and turns a posture of the first divided substrate group from vertical to horizontal.

The two vertical holders hold the first divided substrate group made by taking every other substrate out of the substrates, achieving a widened pitch between two adjacent substrates. Accordingly, the horizontal substrate transport mechanism can take the substrates from the posture turning unit easily.

Moreover, it is preferred that the substrate treating apparatus described above further includes a relative moving unit configured to move the substrate holder and the two vertical holders relatively horizontally, and a relative lifting member configured to move the substrate holder and the two vertical holders relatively vertically, and that, when the posture turning unit receives the substrates from the substrate holder, the relative moving unit and the relative lifting member are brought into a pre-received state where the two vertical holders are arranged below the substrate holder, the relative lifting member is brought from the pre-received state to a received state where the two vertical holders are arranged above the substrate holder, whereby the two vertical holders receive the substrates in a vertical posture held by the substrate holder, and the support base rotator rotates the support base around the horizontal axis, whereby a posture of the substrates held by the two vertical holders is turned from vertical to horizontal.

The substrate holder and the two vertical holders are moved relatively horizontally, and are also moved relatively vertically, whereby the posture turning unit can receive the substrates from the substrate holder.

Moreover, it is preferred that the substrate treating apparatus described above further includes a stand-by tank configured to store a liquid in which the substrates held by the substrate holder are immersed. If the substrates are dried, substrate pattern collapse occurs. However, the present invention can prevent drying of the substrates held by the substrate holder.

Moreover, it is preferred in the substrate treating apparatus described above that the holding grooves are each formed in a V shape such that a width thereof in a thickness direction of the substrates is narrower toward its depth. Accordingly, the substrates in a vertical posture can be held with the holding grooves. Here, it is assumed that the two vertical holders keep holding the substrates after the posture of the substrates is turned to horizontal. In this case, since the substrates are restricted, load is applied to the substrates when the substrates are to be moved upward and transported. With the aspect of the present invention, however, the two vertical holders are brought into the releasing state, whereby the first holder body and the second holder body release holding of the substrates. This can prevent load application to the substrates.

Moreover, it is preferred in the substrate treating apparatus described above that the state changing unit causes the first holder body and the second holder body in a state where the first holder body and the second holder body grip the substrates to rotate around the first rotating member and the second rotating member, respectively, toward a direction apart from the two horizontal holders in order to bring the two vertical holders into the releasing state. This can release the substrates from the two holder bodies while the two rotating members prevent positional shift of the substrates.

Advantageous Effects of Invention

The substrate treating apparatus according to the aspect of the present invention can release holding of the substrates with the two vertical holders satisfactorily.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1A:
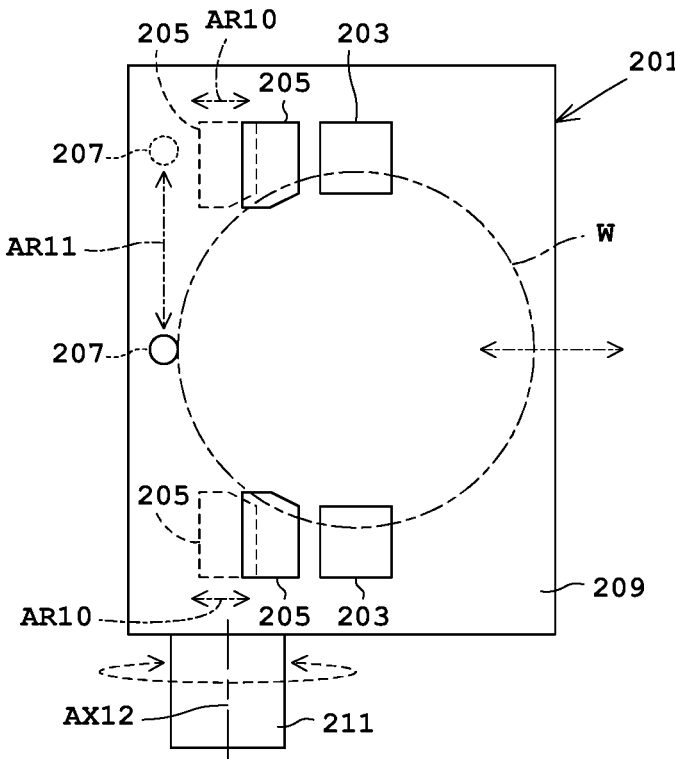
FIG. 1A is a plan view illustrating a currently-used posture changing mechanism.
Figure 1B:
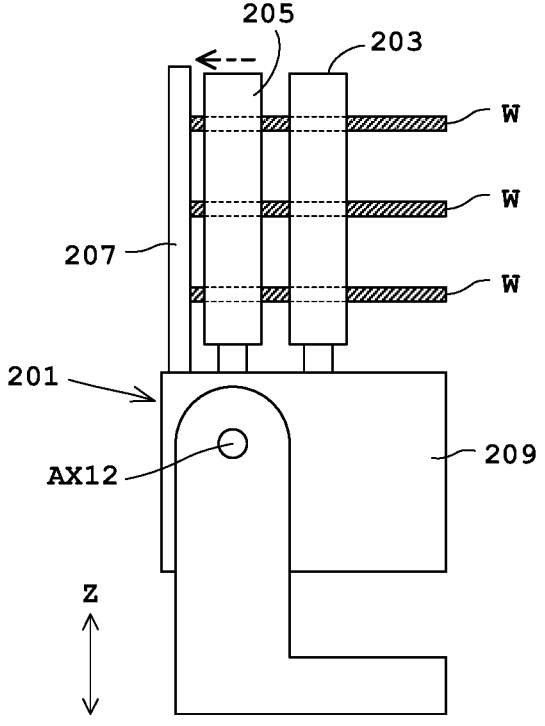
FIG. 1B is a side view illustrating operation of the currently-used posture changing mechanism.
Figure 2:
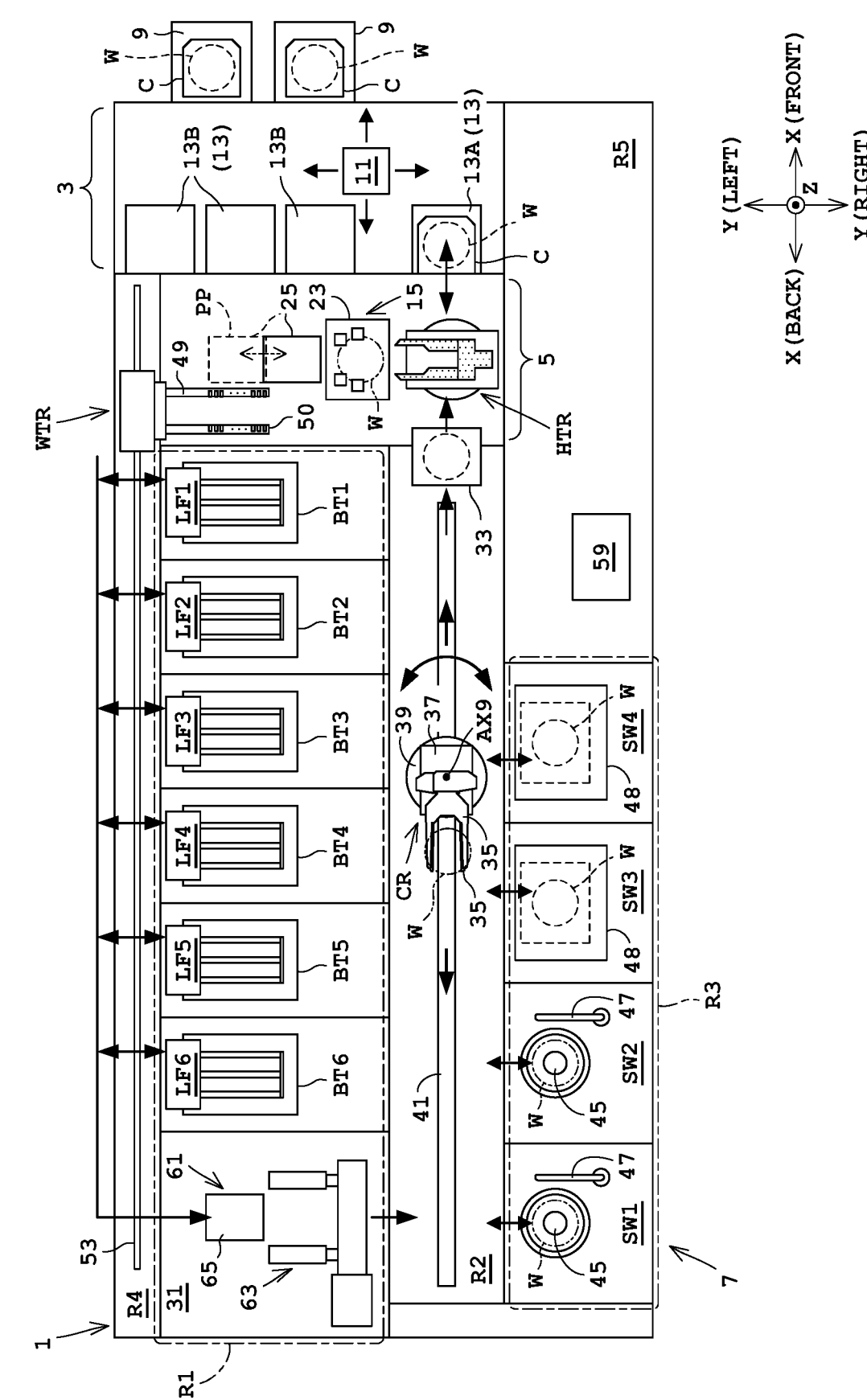
FIG. 2 is a plan view schematically illustrating a configuration of a substrate treating apparatus according to a first embodiment of the present invention.
Figure 3:
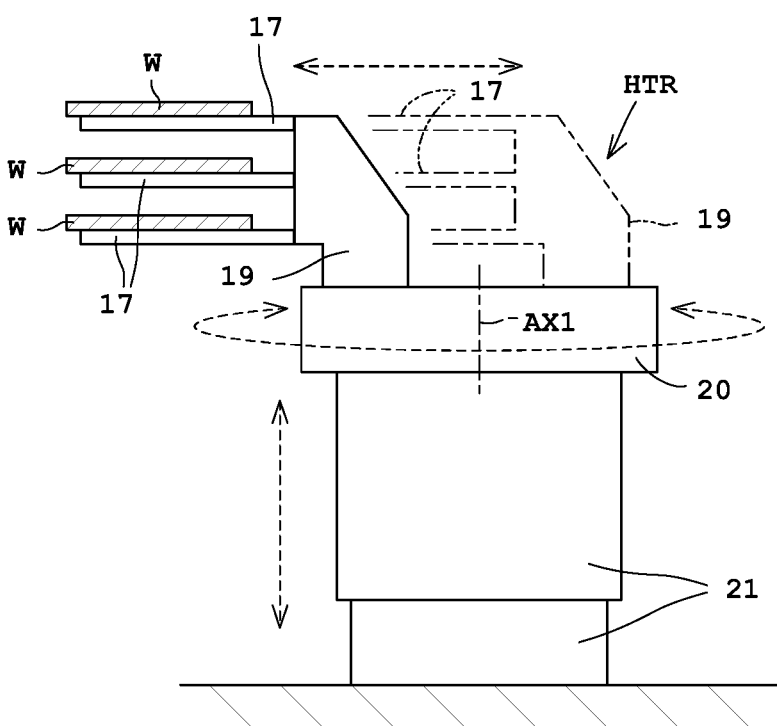
FIG. 3 is a side view of a substrate handling mechanism.

A first embodiment of the present invention will now be described with reference to the drawings. FIG. 2 is a plan view schematically illustrating a configuration of a substrate treating apparatus 1 according to a first embodiment of the present invention. FIG. 3 is a side view of a substrate handling mechanism HTR.

1. Overall Configuration

Reference is made to FIG. 2. The substrate treating apparatus 1 includes a stocker block 3, a transferring block 5, and a treating block 7. The stocker block 3, the transferring block 5, and the treating block 7 are arranged in this order in line in a horizontal direction.

The substrate treating apparatus 1 performs chemical liquid treatment, cleaning treatment, dry treatment, and the like, for example, on the substrates W. The substrate treating apparatus 1 successively performs batch treatment and single-wafer treatment to substrates W. That is, the substrate treating apparatus 1 performs the batch treatment to the substrates W, and then performs the single-wafer treatment to the substrates W. The batch treatment is a process system of performing treatment collectively on a plurality of substrates W. The single-wafer treatment is a process system of performing treatment on a plurality of substrates W one by one.

In the present specification, the direction in which the stocker block 3, the transferring block 5, and the treating block 7 are arranged is referred to as a "front-back direction X" for convenience. The front-back direction X is horizontal. One direction of the front-back direction X from the transferring block 5 to the stocker block 3 is referred to as "forward". The direction opposite to the forward direction is referred to as "rearward". A horizontal direction orthogonal to the front-back direction X is referred to as a "transverse direction Y". Moreover, one direction of the transverse direction Y is referred to as a "rightward direction" appropriately. The direction opposite to the rightward direction is referred to as "leftward". The perpendicular direction relative to the horizontal direction is referred to as a "vertical direction Z". For reference, FIG. 2 shows front, rear, right, left, up, and down, as appropriate, for example, in FIG. 2.

2. Stocker Block

The stocker block 3 accommodates at least one carrier C. One or more (e.g., two) load ports 9 are provided in the stocker block 3. The stocker block 3 includes a carrier transport mechanism (robot) 11 and shelves 13.

The carrier transport mechanism 11 transports the carrier C between the load port 9 and the shelf 13. The carrier transport mechanism 11 includes a gripper configured to grip a projected portion on an upper face of the carrier C, or a hand configured to support the carrier C while contacting a bottom face of the carrier C. The shelf 13 is classified into a shelf 13A for taking and housing the substrates W and a shelf 13B for storage.

The shelf 13A adjoins the transferring block 5. The shelf 13A may be provided with a mechanism for attaching and detaching a lid of the carrier C. At least one shelf 13A is provided. The shelf 13A places the carrier C thereon. The carrier C accommodates a plurality of (e.g., twenty-five) substrates W in a horizontal posture at a predetermined pitch (e.g., a pitch of 10 mm) in the vertical direction Z. Here, the substrates W are aligned in a thickness direction thereof. A front opening unify pod (FOUP) is used as the carrier C, for example. The FOUP is a sealing container. The carrier C may be an opened container, which type is not specified.

3. Transferring Block

The transferring block 5 adjoins rearward X of the stocker block 3. The transferring block 5 includes a substrate handling mechanism (robot) HTR and a first posture turning mechanism 15.

The substrate handling mechanism HTR is provided rightward Y in the transferring block 5. The substrate handling mechanism HTR can collectively transport a plurality of (e.g., twenty-five) substrates W in a horizontal posture among the carrier C placed on the shelf 13A, the first posture turning mechanism 15, and a buffer unit 33 (mentioned later).

Reference is made to FIG. 3. The substrate handling mechanism HTR includes a plurality of (e.g., twenty-five) hands 17. In FIG. 3, the substrate handling mechanism HTR includes three hands 17 for convenience of illustration. The hands 17 each hold one substrate W.

The substrate handling mechanism HTR further includes a hand supporting portion 19, an advancing and withdrawing portion 20, and a lifting and rotating portion 21. The hand supporting portion 19 supports a plurality of hands 17. Accordingly, the hands 17 are moved integrally. The advancing and withdrawing portion 20 causes the hands 17 to advance and withdraw via the hand supporting portion 19. The lifting and rotating portion 21 rotates the advancing and withdrawing portion 20 around a vertical axis AX1, thereby rotating the hands 17 and the like around the vertical axis AX1. Moreover, the lifting and rotating portion 21 moves the advancing and withdrawing portion 20 upward and downward, thereby moving the hands 17 and the like upward and downward. The lifting and rotating portion 21 is fixed on the floor. That is, the lifting and rotating portion 21 does not move in the horizontal direction. Here, the advancing and withdrawing portion 20 and the lifting and rotating portion 21 each include an electric motor. Here, the substrate handling mechanism HTR may include another hand, not shown, for transporting one substrate W in addition to the hands 17 and the hand supporting portion 19.

Reference is made to FIG. 2. The first posture turning mechanism 15 turns a posture of the substrates W, taken out of the carrier C, from horizontal to vertical. The first posture turning mechanism 15 includes a posture turning unit 23 and a pusher mechanism 25. In FIG. 2, the substrate handling mechanism HTR, the posture turning unit 23, and the pusher mechanism 25 are arranged leftward Y in this order. FIGS. 4A to 4F are each a side view illustrating the first posture turning mechanism 15 (posture turning unit 23 and pusher mechanism 25) in the transferring block 5.

Figure 4A:
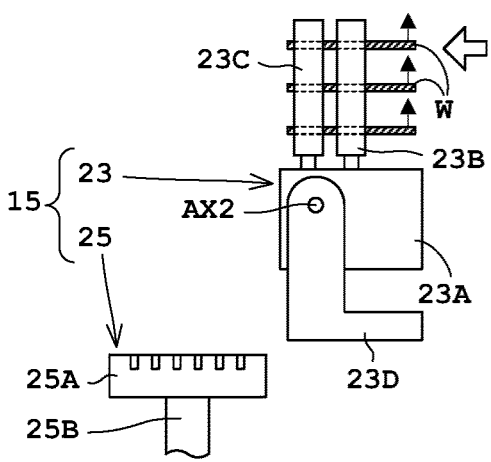
FIGS. 4A to 4F are each a side view for explanation of a first posture turning mechanism (posture turning unit and pusher mechanism) in a transferring block.

As shown in FIGS. 2 and 4A, the posture turning unit 23 includes a support base 23A, one-paired horizontal holders 23B, one-paired vertical holders 23C, and a rotation driving portion 23D. The one-paired horizontal holders 23B and the one-paired vertical holders 23C are provided on the support base 23A. The horizontal holders 23B and the vertical holders 23C receive the substrates W transported by the substrate handling mechanism HTR. When the substrates W are in the horizontal posture, the one-paired horizontal holders 23B support the substrates W from below while contacting a lower face of each of the substrates W. In contrast to this, when the substrates W are in the vertical posture, the one-paired vertical holders 23C hold the substrates W.

The rotation driving portion 23D supports the support base 23A rotatably around a horizontal axis AX2. Moreover, the rotation driving portion 23D rotates the support base 23A around the horizontal axis AX2, whereby a posture of the substrates W held by the holders 23B and 23C is turned from horizontal to vertical.

Figure 4B:
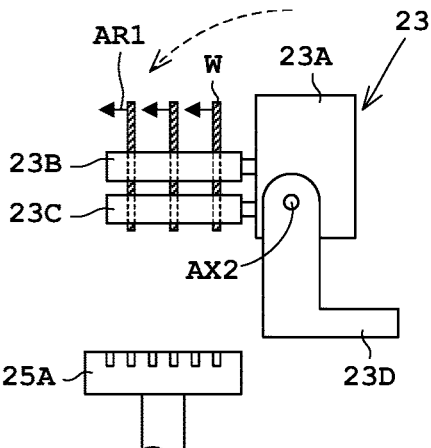
Figure 4C:
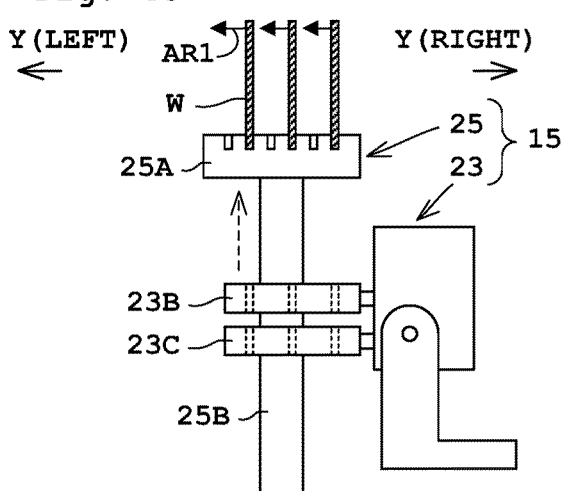
Figure 4D:
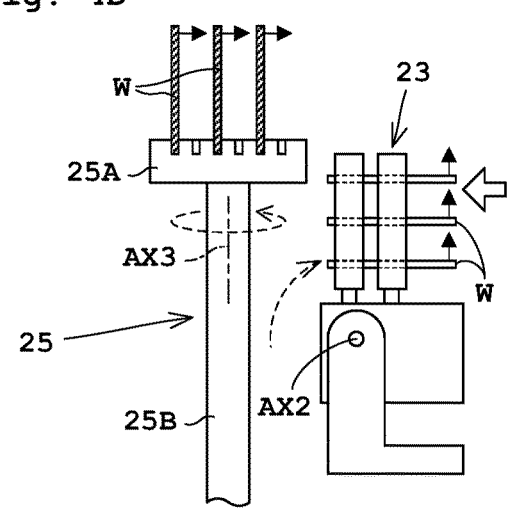
Figure 4E:
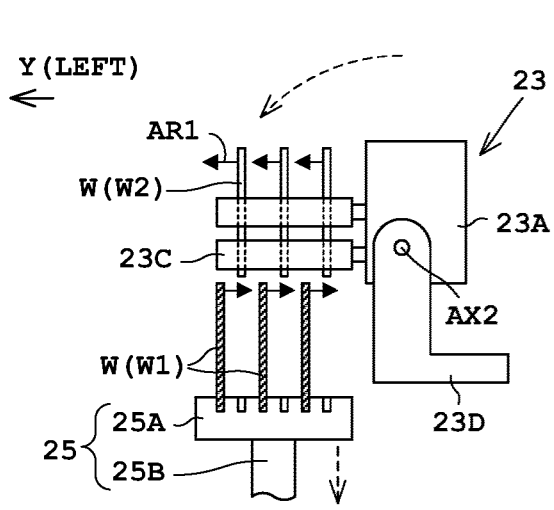
Figure 4F:
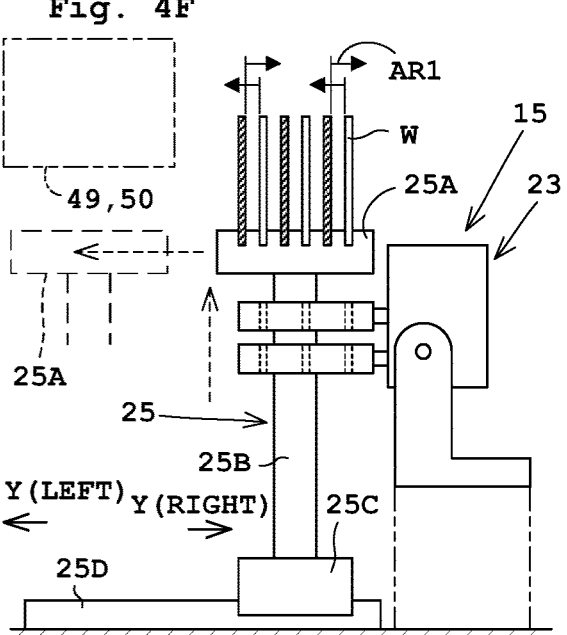

As illustrated in FIGS. 2 and 4F, the pusher mechanism 25 includes a pusher 25A, a lifting and rotating portion 25B, a horizontally moving portion 25C, and a rail 25D. The pusher 25A supports each lower part of plurality of (e.g., fifty) substrates W in the vertical posture. Here in FIGS. 4A to 4F, the pusher 25A is configured so as to be able to support six substrates W for convenience of illustration.

The lifting and rotating portion 25B is connected to a lower face of the pusher 25A. The lifting and rotating portion 25B expands and contracts, thereby moving the pusher 25A in the up-down direction. Moreover, the lifting and rotating portion 25B rotates the pusher 25A around a vertical axis AX3. The horizontally moving portion 25C supports the lifting and rotating portion 25B. The horizontally moving portion 25C moves the pusher 25A and the lifting and rotating portion 25B horizontally along the rail 25D. The rail 25D is formed so as to extend in the transverse direction Y. The rotation driving portion 23D, the lifting and rotating portion 25B, and the horizontally moving portion 25C each include an electric motor.

Description is now made of operation of the first posture turning mechanism 15. Batch process tanks BT1 to BT6, mentioned later, in the treating block 7 each perform treatment on fifty substrates W in two carriers C, for example, collectively. The first posture turning mechanism 15 turns a posture of the fifty substrates W in a batch of twenty-five. Moreover, the first posture turning mechanism 15 arranges the substrates W at a predetermined pitch (e.g., a half pitch) in a face-to-face system. Here, a half pitch is a pitch of 5 mm, for example. The pusher mechanism 25 transports the fifty substrates W to the transport mechanism WTR.

Here, twenty-five substrates W in a first carrier C are to be described as substrates W1 in a first substrate group. Twenty-five substrates W in a second carrier C are to be described as substrates W2 in a second substrate group. Moreover, description is made in FIGS. 4A to 4F that the number of substrates W1 in the first substrate group is three, and the number of substrates W2 in the second substrate group is three for convenience of illustration. Moreover, when no particular distinction is made between the substrate W1 and the substrate W2, the substrate W1 and the substrate W2 are described as a "substrate W".

Reference is made to FIG. 4A. The posture turning unit 23 receives twenty-five substrates W1 in a first substrate group, transported from the substrate handling mechanism HTR, with the holders 23B, 23C. At this time, the twenty-five substrates W1 are in a horizontal posture, and device faces thereof are directed upward. The twenty-five substrates W1 are arranged at a predetermined pitch (full pitch). Here, a full pitch is a pitch of 10 mm, for example. The full pitch is also called a normal pitch.

Here, a half pitch is half the full pitch. Moreover, the device face of the substrate W (W1, W2) is a face where electronic circuits are formed, and is called a "front face". Moreover, a back face of the substrate W is a face where no electronic circuits are formed. A face opposite to the device face corresponds to the back face.

Reference is made to FIG. 4B. The posture turning unit 23 rotates the holders 23B, 23C by 90 degrees around the horizontal axis AX2 to turn a posture of the twenty-five substrates W1 from horizontal to vertical. Reference is made to FIG. 4C. The pusher mechanism 25 moves the pusher 25A upward to a position higher than the holders 23B, 23C of the posture turning unit 23. Accordingly, the pusher 25A receives the twenty-five substrates W1 from the holders 23B, 23C. The twenty-five substrates W1 held by the pusher 25A are directed leftward Y. Here in FIGS. 4A to 4F, a direction of the device face of the substrate W is denoted by an arrow AR1.

Reference is made to FIG. 4D. The pusher mechanism 25 rotates the twenty-five substrates W1 in the vertical posture by 180 degrees around the vertical axis AX3. Accordingly, the twenty-five substrates W1 are reversed to be directed rightward Y. Moreover, the reversed twenty-five substrates W1 are moved leftward Y from a position before the reverse by a half pitch (e.g., 5 mm). Moreover, the holders 23B, 23C of the posture turning unit 23 are rotated by −90 degrees around the horizontal axis AX2 such that the holders 23B, 23C can receive next substrates W2. Thereafter, the posture turning unit 23 receives twenty-five substrates W2 in a second substrate group, that are transported from the substrate handling mechanism HTR, with the holders 23B, 23C. At this time, the twenty-five substrates W2 are in a horizontal posture, and device faces thereof are directed upward. Here, the posture turning unit 23 and the pusher mechanism 25 operate so as not to interfere with each other.

Reference is made to FIG. 4E. The pusher mechanism 25 moves the pusher 25A, holding the twenty-five substrates W1 in the first substrate group, downward to a retreating position. Thereafter, the posture turning unit 23 turns a posture of the twenty-five substrates W2 from horizontal to vertical. The twenty-five substrates W2 whose posture is turned are directed leftward Y. Reference is made to FIG. 4F. Thereafter, the pusher mechanism 25 moves upward the pusher 25A, holding the twenty-five substrates W2 in the second substrate group. Accordingly, the pusher mechanism 25 also receives the twenty-five substrates W2 from the posture turning unit 23.

Accordingly, the pusher 25A holds fifty substrates W (W1, W2) in the first substrate group and the second substrate group. For the fifty substrates W, the twenty-five substrates W1 and the twenty-five substrates W2 are alternately arranged one by one. The fifty substrates W are arranged at a half pitch (e.g., 5 mm). Moreover, the twenty-five substrates W1 are directed in a reverse direction to the direction of the twenty-five substrates W2. Consequently, the fifty substrates W are arranged in a face-to-face system. That is, for adjacent two substrates W1, W2, two device faces thereof (or two back faces) face each other.

Thereafter, the pusher mechanism 25 moves the pusher 25A, holding the fifty substrates W, to a substrate delivery position PP below one-paired chucks 49, 50 of the transport mechanism WTR along the rail 25D.

4. Treating Block 7

The treating block 7 adjoins the transferring block 5. The treating block 7 includes a batch treatment region R1, a single-wafer transportation region R2, a single-wafer treatment region R3, and a batch substrate transport region R4. The substrate treating apparatus 1 further includes an electrical parts installation region R5.

4-1. Batch Treatment Region R1

The batch treatment region R1 adjoins the transferring block 5, the single-wafer transportation region R2, and the batch substrate transport region R4. Moreover, the batch treatment region R1 is provided between the single-wafer transportation region R2 and the batch substrate transport region R4. The batch treatment region R1 has a first end side adjoining the transferring block 5, and a second end side extending in a direction so as to be apart from the transferring block 5, i.e., rearward X.

The batch treatment region R1 contains six batch process tanks BT1 to BT6 and a second posture turning mechanism 31, for example. The six batch process tanks BT1 to BT6 are arranged in line in the front-back direction X where the batch treatment region R1 extends. Moreover, the second posture turning mechanism 31 is provided opposite to the first posture turning mechanism 15 of the transferring block 5 across the six batch process tanks BT1 to BT6. That is, the six batch process tanks BT1 to BT6 are arranged between the two posture turning mechanisms 15, 31. Moreover, the second posture turning mechanism 31 is arranged on an extension line of the six batch process tanks BT1 to BT6. Note that the number of batch process tanks is not limited to six, and the number only needs to be plural.

The six batch process tanks BT1 to BT6 each perform immersion treatment on a plurality of substrates W in the vertical posture collectively. For example, the six batch process tanks BT1 to BT6 is formed by four chemical liquid process tanks BT1 to BT4 and two water cleaning process tanks BT5 and BT6. Specifically, the two chemical liquid process tanks BT1 and BT2 and the water cleaning process tank BT5 are set as one set. Then, the two chemical liquid process tanks BT3 and BT4 and the water cleaning process tank BT6 are set as another set.

The four chemical liquid process tanks BT1 to BT4 each perform etching treatment with chemical. A phosphoric acid liquid is used as the chemical, for example. The chemical liquid process tank BT1 stores the chemical supplied from a chemical liquid jet pipe, not shown. The chemical liquid jet pipe is provided in an inner wall of the chemical liquid process tank BT1. The three chemical liquid process tanks BT2 to BT4 are each configured in the same manner as the chemical liquid process tank BT1.

The two water cleaning process tanks BT5 and BT6 each perform pure water cleaning treatment by cleaning off the chemical, adhered to the substrates W, with pure water. Deionized water (DIW) is, for example, used as pure water. The two water cleaning process tanks BT5 and BT6 each store deionized water supplied from a cleaning liquid jet pipe, not shown. The cleaning liquid jet pipe is provided in inner walls of the water cleaning process tanks BT5 and BT6.

The six batch process tanks BT1 to BT6 contain six lifters LF1 to LF6, respectively. For example, the lifter LF1 holds the substrates W arranged at a predetermined pitch (half pitch) in the vertical posture. Moreover, the lifter LF1 moves the substrates W upward and downward between a treating position inside of the batch process tank (chemical liquid process tank) BT1 and a delivery position above the batch process tank BT1. The other five lifters LF2 to LF6 are configured in the same manner as the lifter LF1.

The second posture turning mechanism 31 collectively turns a posture of the substrates W, on which batch treatment is performed, from vertical to horizontal entirely or partially. Detailed description is made later of the second posture turning mechanism 31. Here, the second posture turning mechanism 31 corresponds to the posture turning mechanism in the present invention.

4-2. Single-Wafer Transportation Region R2

The single-wafer transportation region R2 adjoins the transferring block 5, the batch treatment region R1, the single-wafer treatment region R3, and the electrical parts installation region R5. Moreover, the single-wafer transportation region R2 is provided between the batch treatment region R1 and the single-wafer treatment region R3. The single-wafer transportation region R2 has a first end side adjoining the transferring block 5. Moreover, the single-wafer transportation region R2 has a second end side extending in a direction so as to be apart from the transferring block 5, i.e., rearward X.

The single-wafer transportation region R2 contains the center robot CR and the buffer unit 33. The center robot CR transports the substrates among the second posture turning mechanism 31, single-wafer processing chambers SW1 to SW4, mentioned later, and the buffer unit 33. For example, the center robot CR transports the substrates W one by one in the horizontal posture to the single-wafer processing chambers SW1 to SW4 individually.

The center robot CR includes two hands 35, the advancing and withdrawing portion 37, a lifting and rotating portion 39, and a horizontally moving unit 41 (including a guide rail). The two hand 35 each hold one substrate W in a horizontal posture.

The advancing and withdrawing portion 37 supports the hands 35 movably, and moves the hands 35 forward and rearward. The rotation lifting and rotating portion 39 rotates the hands 35 and the advancing and withdrawing portion 37 around a vertical axis AX9. Moreover, the lifting and rotating portion 39 moves the hands 35 and the advancing and withdrawing portion 37 upward and downward. The guide rail is provided on a floor of the single-wafer transportation region R2 along a direction where the single-wafer transportation region R2 extends. The horizontally moving unit 41 moves the hands 35, the advancing and withdrawing portion 37, and the like along the guide rail in the front-back direction X. Here, the advancing and withdrawing portion 37, the lifting and rotating portion 39, and the horizontally moving unit 41 each include an electric motor.

For example, the advancing and withdrawing portion 37 moves the two hands forward to take two substrates W from the second posture turning mechanism 31. Then, the advancing and withdrawing portion 37 may move one of the hands 35, holding one substrate W, forward to transport the one substrate W to one of the single-wafer processing chambers. Here, the center robot CR may include one hand 35 or three or more hands 35. When the center robot CR includes three or more hands 35, the center robot CR moves the three or more hands forward and rearward individually.

The buffer unit 33 includes a plurality of mount shelves. The mount shelves are in a horizontal posture. Each of the mount shelves is capable of placing one substrate W. The buffer unit 33 places the substrates W in the horizontal posture at a predetermined pitch (full pitch) in the vertical direction Z. That is, the mount shelves are arranged at a predetermined pitch (full pitch) in the vertical direction. The buffer unit 33 is configured so as to place at least twenty-five substrates W that the substrate handling mechanism HTR can transport. The buffer unit 33 is configured to be capable of placing fifty substrates W, for example.

Here as shown in FIG. 2, the buffer unit 33 is provided in the transferring block and the single-wafer transportation region R2. That is, the buffer unit 33 is provided on a boundary between the transferring block 5 and the single-wafer transportation region R2. Moreover, the buffer unit 33 may be provided in either the transferring block 5 or the single-wafer transportation region R2 only. Accordingly, the buffer unit 33 may be provided fixedly in any of the boundary between the transferring block 5 and the single-wafer transportation region R2, the transferring block 5, or the single-wafer transportation region R2.

4-3. Single-Wafer Treatment Region R3

The single-wafer treatment region R3 adjoins the single-wafer transportation region R2 and the electrical parts installation region R5. A first end side of the single-wafer treatment region R3 is positioned close to the transferring block 5 via the electrical parts installation region R5. In the electrical parts installation region R5, electric circuits and a controller 59 mentioned later necessary for the substrate treating apparatus 1 are provided. Moreover, the single-wafer treatment region R3 has a second end side extending in a direction so as to be apart from the transferring block 5, i.e., rearward X. Moreover, the single-wafer treatment region R3 is provided along the batch treatment region R1 and the single-wafer transportation region R2.

A plurality of (e.g., four) single-wafer processing chambers SW1 to SW4 are provided in the single-wafer treatment region R3. The four single-wafer processing chambers SW1 to SW4 are arranged in the front-back direction X where the single-wafer treatment region R3 extends. The single-wafer processing chambers SW1 to SW4 are each configured to perform treatment on the substrates W one by one. A fourth single-wafer processing chamber SW4, a third single-wafer processing chamber SW3, a second single-wafer processing chamber SW2, and a first single-wafer processing chamber SW1 are arranged in this order from a side adjacent to the transferring block 5. The single-wafer processing chambers SW1 to SW4 may be formed in plural steps. For example, twelve single-wafer processing chambers may be arranged in four in the front-back direction X (horizontal direction) and in three in the vertical direction Z.

For example, the single-wafer processing chambers SW1, SW2 each include a rotating unit 45 and a nozzle 47. The rotating unit 45 includes a spin chuck configured to hold one substrate W in a horizontal posture, and an electric motor configured to rotate the spin chuck around a vertical axis passing through the center of the substrate W. The spin chuck may hold a lower face of the substrate W by vacuum adsorption. Moreover, the spin chuck includes three or more chuck pins for gripping an outer edge of the substrate W.

The nozzle 47 supplies a treatment liquid to the substrate W held by the rotating unit 45. The nozzle 47 moves between a standby position apart from the rotating unit and a supply position above the rotating unit 45. Isopropyl alcohol (IPA) or deionized water is used, for example, as the treatment liquid. The single-wafer processing chambers SW1, SW2 may each perform cleaning treatment on the substrates W with deionized water, and then perform preliminary dry treatment with IPA, or may form an IPA liquid film on top faces of the substrates W, for example.

The single-wafer processing chambers SW3, SW4 performs dry treatment with supercritical fluid, for example. A carbon dioxide liquid is used as the fluid, for example. The single-wafer processing chambers SW3, SW4 each include a chamber body (vessel) 48, a supporting tray, and a lid. The chamber body 48 includes a treating space provided therein, an opening through which the substrates W enter, a supply port, and an exhaust port. The substrates W are accommodated into the treating space while being supported by the support tray. The lid closes the opening of the chamber body 48. For example, the single-wafer processing chambers SW3, SW4 each make the fluid into a supercritical state and supply the supercritical fluid from the supply port into the treating space of the chamber body 48. At this time, gas within the treating space of the chamber body 48 is exhausted from the exhaust port. By the supercritical fluid supplied into the treating space, dry treatment is performed on the substrates W.

The supercritical state is obtained by bringing fluid into critical temperature and pressure inherent in the fluid. Specifically, when the fluid is carbon dioxide, a critical temperature is 31 degrees Celsius and critical pressure is 7.38 MPa. Under the supercritical state, the fluid has a surface tension of approximately zero. Accordingly, patterns of the substrate W are not affected by a gas-liquid interface. Consequently, pattern collapse is unlikely to occur in the substrate W.

4-4. Batch Substrate Transport Region R4

The batch substrate transport region R4 adjoins the transferring block 5 and the batch treatment region R1. The batch substrate transport region R4 is provided along the batch treatment region R1. The batch substrate transport region R4 extend in the front-back direction X. The four regions R1, R2, R3, R4 are provided so as to extend in parallel to one another.

The batch substrate transport region R4 has a transport mechanism (robot) WTR. That is, the batch substrate transport region R4 is provided with the transport mechanism WTR. The transport mechanism WTR transports a plurality of (e.g., fifty) substrates W collectively among the substrate delivery position PP defined in the transferring block 5, the six batch process tanks BT1 to BT6, for example, and the second posture turning mechanism 31.

The transport mechanism WTR includes one-paired chucks 49, 50, and a guide rail 53. The chucks 49, 50 each have fifty holding grooves for holding the fifty substrates W individually, for example. The two chucks 49, 50 extend in parallel in the transverse direction Yin plan view (FIG. 2). The transport mechanism WTR opens and closes the two chucks 49, 50. The transport mechanism WTR moves the one-paired chucks 49, 50, along the guide rail 53. The transport mechanism WTR is driven by an electric motor.

5. Controller

The substrate treating apparatus 1 includes the controller 59 and a memory unit (not shown). The controller 59 controls components of the substrate treating apparatus 1. The controller 59 includes one or more processors like a central processing unit (CPU). The memory unit includes, for example, at least one of a read-only memory (ROM), a random-access memory (RAM), and a hard disk. The memory unit stores computer programs necessary for controlling each component of the substrate treating apparatus 1.

6. Second Posture Turning Mechanism

Figure 5A:
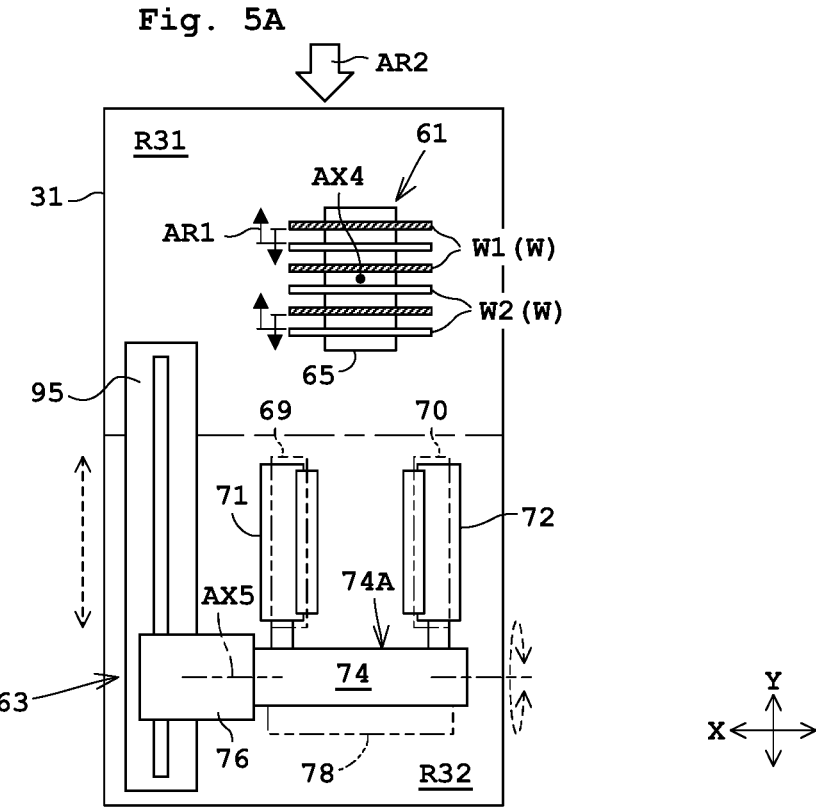
FIG. 5A is a plan view of a second posture turning mechanism.
Figure 5B:
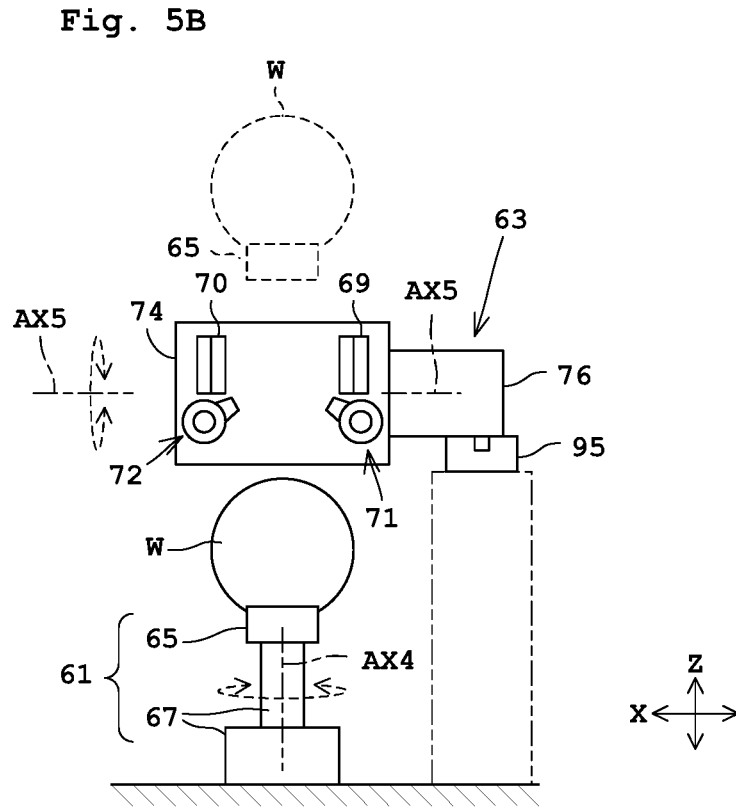
FIG. 5B is a rear view of the second posture turning mechanism when seen from an arrow direction.
Figure 6:
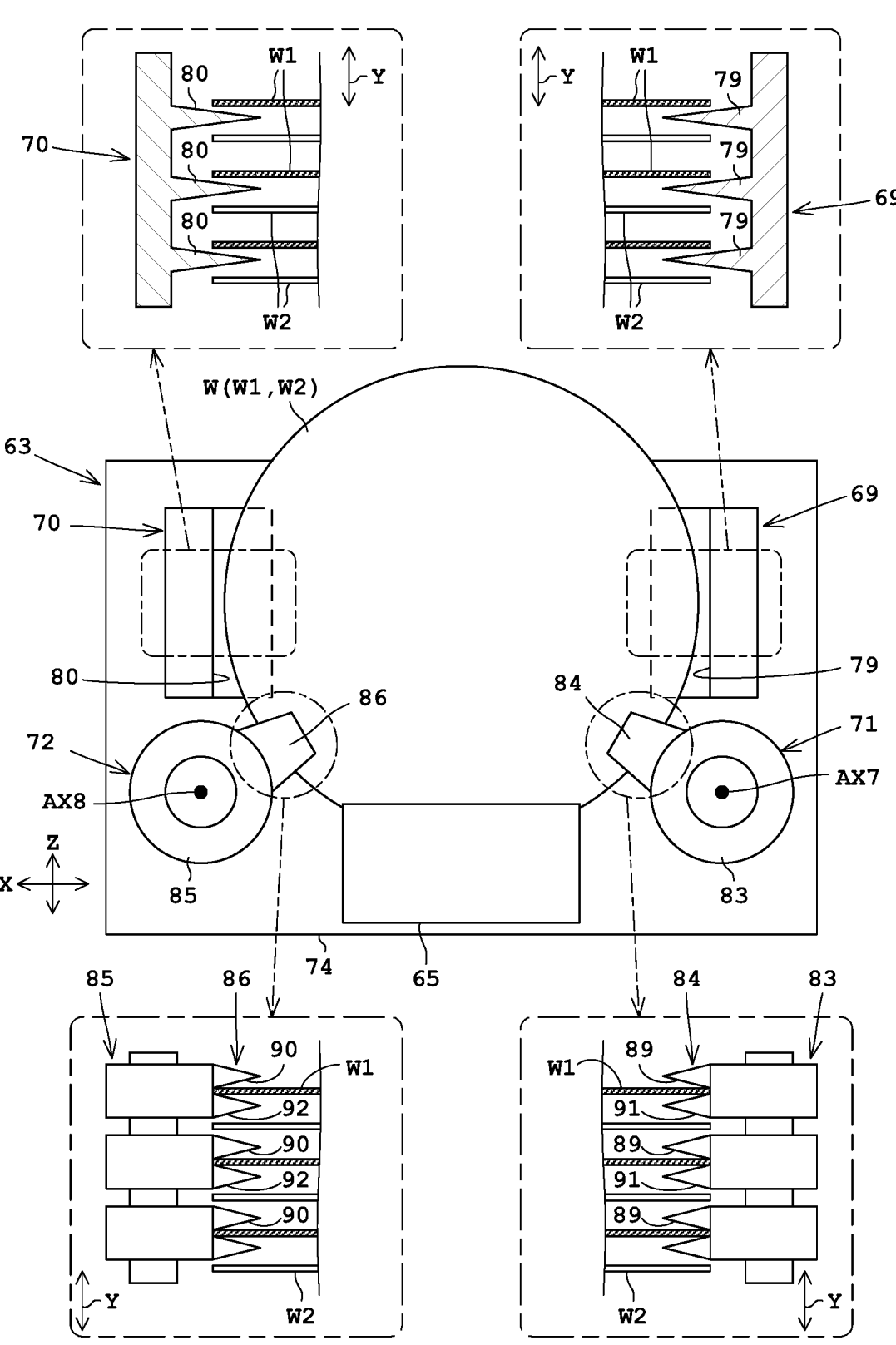
FIG. 6 is a rear view of a posture turning unit.
Figure 7:
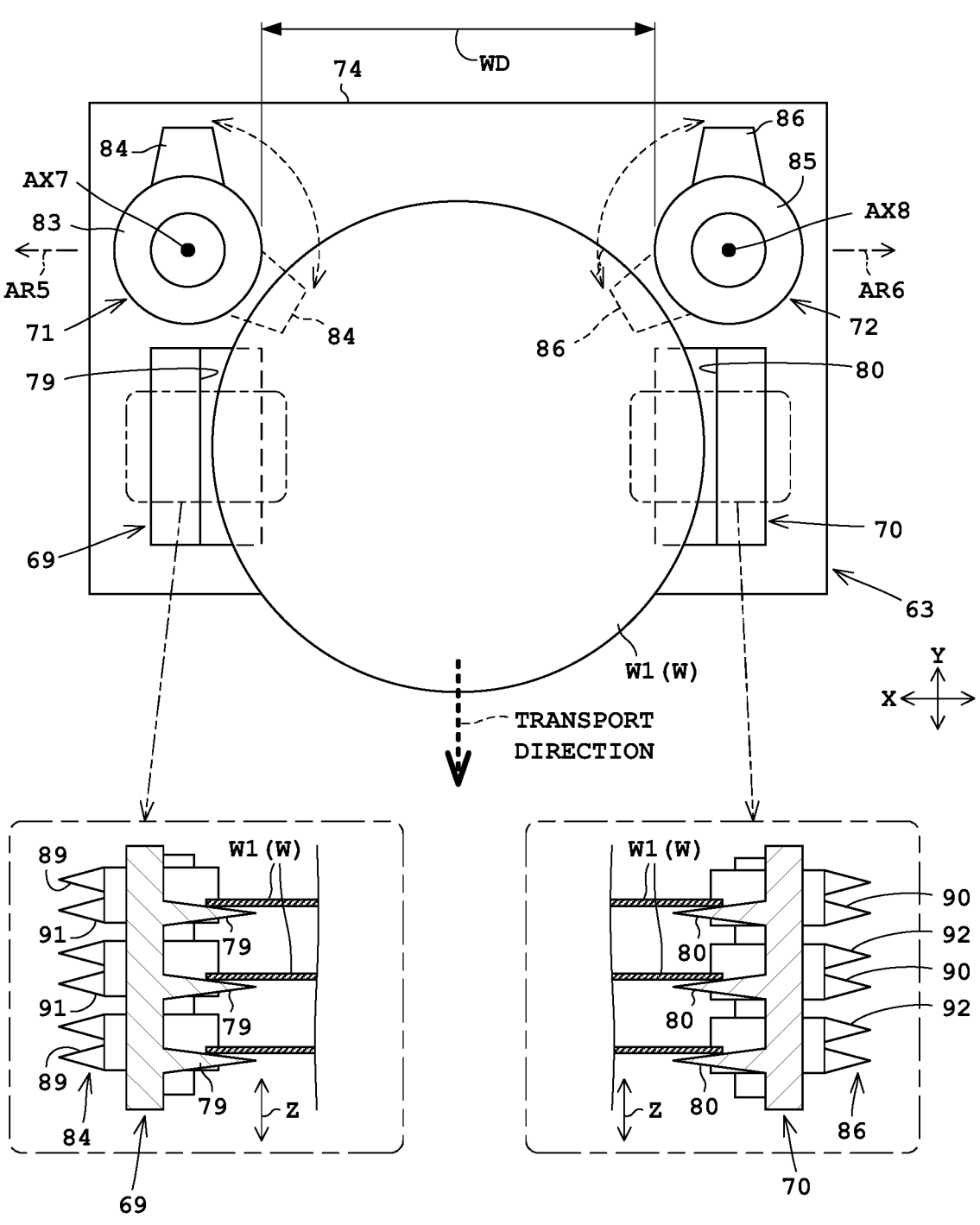
FIG. 7 is a plan view of the posture turning unit.

FIG. 5A is a plan view of the second posture turning mechanism 31. FIG. 5B is a rear view of the second posture turning mechanism 31 seen from an arrow AR2. FIG. 6 is a rear view of a posture turning unit 63. FIG. 7 is a plan view of the posture turning unit 63.

The second posture turning mechanism 31 includes a substrate stand-by region R31 and a substrate posture turning region R32. The substrate stand-by region R31 and the substrate posture turning region R32 are arranged in the transverse direction Y orthogonal to the front-back direction X where the batch treatment region R1 or the six batch process tanks BT1 to BT6 extend.

The second posture turning mechanism 31 includes a pusher mechanism 61 and the posture turning unit 63. The pusher mechanism 61 is provided in the substrate stand-by region R31. In contrast to this, the posture turning unit 63 is provided in the substrate posture turning region R32. The following describes the pusher mechanism 61 and the posture turning unit 63 in detail.

6-1. Pusher Mechanism

The pusher mechanism 61 holds a plurality of (e.g., fifty) substrates W, transported by the transport mechanism WTR, in a vertical posture. The pusher mechanism 61 includes a pusher 65, and a lifting and rotating portion 67 for moving the pusher 65 upward and downward, and rotating the pusher 65 around a vertical axis AX4. This can change orientation of front and back faces of the substrates W appropriately.

The pusher 65 holds fifty substrates W, for example, arranged at a predetermined pitch (e.g., half pitch) from below. The pusher 65 includes holding grooves whose number is same as the number of substrates W (fifty). The holding grooves of the pusher 65 are each formed in a V-shape such that a width thereof in a thickness direction of the substrates W is narrower toward its depth. The lifting and rotating portion 67 includes an electric motor or an air cylinder, for example.

Here, the pusher mechanism 61 (pusher 65) and the six batch process tanks BT1 to BT6 are arranged linearly in the front-back direction X such that the transport mechanism WTR can transport the fifty substrates W linearly. Here, the pusher 65 corresponds to the substrate holder in the present invention. The lifting and rotating portion 67 corresponds to the lateral rotator and the relative lifting member in the present invention.

6-2. Posture Turning Unit

The posture turning unit 63 receives the substrates W from the pusher 65, and turns a posture of the substrates W from vertical to horizontal. Alternatively, the posture turning unit 63 receives either the first substrate group (two or more substrates W1) or the second substrate group (two or more substrates W2) of the substrates W from the pusher 65, and turns a posture of the received first substrate group or the received second substrate group from vertical to horizontal.

The posture turning unit 63 includes two horizontal holders 69, 70, two vertical holders 71, 72, a support base 74, a support base rotator 76, and a rotation driving unit 78. The support base 74 supports the two horizontal holders 69, 70, and the two vertical holders 71, 72. The support base rotator 76 rotates the support base 74 around a horizontal axis AX5. The support base rotator 76 includes an electric motor, for example. Here, the horizontal axis AX5 extends in the front-back direction X.

The two horizontal holders 69, 70 each extend perpendicularly with respect to a support face 74A of the support base 74. The two horizontal holders 69, 70 each house a plurality of (e.g., twenty-five) substrates W. Specifically, the two horizontal holders 69, 70 house two sides of each of the substrates W opposite to each other in a radial direction. As shown in a frame of FIG. 7, the two horizontal holders 69, 70 place the substrates W thereon when the substrates W are in a horizontal posture.

As shown in FIGS. 6, 7, the two horizontal holders 69, 70 include plural-paired (e.g., twenty-five-paired) horizontal guides 79, 80, respectively, that are arranged at a predetermined pitch (e.g., full pitch). A first horizontal holder 69 includes a plurality of (e.g., twenty-five) horizontal guides 79. The horizontal guides 79 are arranged in a thickness direction where the substrates W are aligned. A second horizontal holder 70 includes a plurality of horizontal guides 80. The horizontal guides 80 are arranged in a thickness direction where the substrates W are aligned. For example, when the two horizontal holders 69, 70 house fifty substrates W in a vertical posture arranged at a half pitch, adjacent two-paired horizontal guides 79, 80 are configured so as to be able to house two substrates W1, W2, respectively.

As shown in FIG. 6, when a plurality of (e.g., fifty) substrates W are in a vertical posture, the two vertical holders 71, 72 hold a plurality of (e.g., twenty-five) sub-strates W, housed by the two horizontal holders 69, 70, in the vertical posture. Moreover, when the substrates W are in the vertical posture, the two vertical holders 71, 72 are provided below the two horizontal holders 69, 70. Moreover, as shown in FIG. 7, when the substrates W are in a horizontal posture, the two vertical holders 71, 72 are provided closer to the pusher 65 than the two horizontal holders 69, 70 (see FIG. 12C, mentioned later).

Here, when the substrates W held by the two vertical holders 71, 72 are in the vertical posture, the two horizontal holders 69, 70 are arranged in the front-back direction X while supporting the substrates W. Likewise, when the substrates W are in the vertical posture, the two vertical holders 71, 72 are arranged in the front-back direction X while gripping the substrates W.

A first vertical holder 71 includes a first rotating member 83 and a first holder body 84. The first rotating member 83 extends perpendicularly with respect to the support face 74A of the support base 74. The first holder body 84 is provided so as to protrude from the first rotating member 83 in a direction (radial direction) orthogonal to the extension direction where the first rotating member 83 extends. Likewise, a second vertical holder 72 includes a second rotating member 85 and a second holder body 86. The second rotating member 85 extends perpendicularly with respect to the support face 74A of the support base 74. The second holder body 86 is provided so as to protrude from the second rotating member 85 in a direction (radial direction) orthogonal to the extension direction where the second rotating member 85 extends.

Moreover, the two vertical holders 71, 72 include plural-paired (e.g., twenty-five-paired) holding grooves 89, 90 and plural-paired (e.g., twenty-five-paired) passing grooves 91, 92, respectively. The plural-paired holding grooves 89, 90 and the plural-paired passing grooves 91, 92 are alternately arranged, respectively. Each of the plural-paired holding grooves 89, 90 hold one substrate W. The holding grooves 89, 90 are each formed in a V-shape such that a width thereof in a thickness direction of the substrates W is narrower toward its depth. Accordingly, the substrates W in a vertical posture can be held with the holding grooves 89, 90. Each of the plural-paired passing grooves 91, 92 do not hold one substrate W, but pass one substrate W.

The first holder body 84 has a plurality of holding grooves 89 and a plurality of passing grooves 91 provided in the alignment direction of the substrates W. The holding grooves 89 and the passing grooves 91 are arranged alternately. Such configuration is made for holding the first substrate group (twenty-five substrates W1) or the second substrate group (twenty-five substrates W2), made by taking every other substrate out of the fifty substrates W, held by the pusher 65, for example, with use of twenty-five holding grooves 89 (twenty-five-paired holding grooves 89, 90). Moreover, the second holder body 86 has a plurality of holding grooves 90 and a plurality of passing grooves 92 provided in the alignment direction of the substrates W. The holding grooves 90 and the passing grooves 92 are arranged alternately.

The two rotating members 83, 85 are arranged by a width WD smaller than a diameter of each of the substrates W. Accordingly, the substrates W cannot pass between the two rotating members 83, 85. Here as shown in FIG. 12B, mentioned later, the passing grooves 91, 92 pass the substrates W2. The first rotating member 83 is rotatable around a central axis AX7. Likewise, the second rotating member 85 is rotatable around a central axis AX8. The two central axes AX7, AX8 each extend perpendicularly with respect to the support face 74A of the support base 74 and in the alignment direction of the substrates W.

The rotation driving unit 78 rotates the first rotating member 83 and the first holder body 84 integrally around the central axis AX7. At the same time, the rotation driving unit 78 rotates the second rotating member 85 and the second holder body 86 integrally around the central axis AX8. The rotation driving unit 78 includes an electric motor. Here, the rotation driving unit 78 corresponds to the state changing unit in the present invention.

Accordingly, the rotation driving unit 78 rotates the two holder bodies 84, 86 around the two rotating members 83, 85 (central axes AX7, AX8), respectively, whereby the two vertical holders 71, 72 are changed into a holding state or a releasing state. That is, the rotation driving unit 78 changes a state of the two vertical holders 71, 72 between the holding state and the releasing state.

The holding state is a state where the two vertical holders 71, 72 can hold the substrates W. Under the holding state, the two vertical holders 71, 72 grip (support) the substrates W with the two holder bodies 84, 86 to hold the substrates W in the plural-paired holding grooves 89, 90. The releasing state is a state where the two holder bodies 84, 86 release the holding state. Under the releasing state, the substrates W are released from the two holder bodies 84, 86, whereby the substrates W are not held with the plural-paired holding grooves 89, 90.

Under the releasing state in FIG. 7, the two holder bodies 84, 86 illustrated by solid lines are positioned leftward Y of the two rotating members 83, 85. For example, the first holder body 84 is positioned opposite to the first horizontal holder 69 across the first rotating member 83. From such a state, the rotation driving unit 78 rotates the first holder body 84 clockwise, and rotates the second holder body 86 counterclockwise. At this time, the two holder bodies 84, 86 pass between the two rotating members 83, 85. Then, the two holder bodies 84, 86 are moved to a position illustrated by dotted lines, thereby brought into the holding state.

Moreover, when the holding state is changed to the releasing state in FIG. 7, the rotation driving unit 78 rotates the first holder body 84 illustrated by dotted lines counterclockwise, and rotates the second holder body 86 illustrated by dotted lines clockwise. At this time, the two holder bodies 84, 86 pass between the two rotating members 83, 85. That is, in order to bring the two vertical holders 71, 72 into the releasing state, the rotation driving unit 78 rotates the two holder bodies 84, 86 in a state where the substrates W are gripped with the two holder bodies 84, 86 around the two rotating members 83, 85 (central axes AX7, AX8), respectively, from toward a direction apart from the two horizontal holders 69, 70. This can change the holding state into the releasing state while the positional shift of the substrates W can be prevented with the two rotating members 83, 85.

Moreover, as shown in FIGS. 5A, 5B, the second posture turning mechanism 31 includes a horizontally moving portion 95. The horizontally moving portion 95 move two horizontal holders 69, 70, two vertical holders 71, 72, a support base 74, a support base rotator 76, and a rotation driving unit 78 linearly in the transverse direction Y. The horizontally moving portion 95 includes an electric motor. Here, the horizontally moving portion 95 may move the support base 74 and the like not only in the transverse direction Y but also in the front-back direction X. The horizontally moving portion 95 corresponds to the relative moving unit in the present invention.

7. Operation Explanation

Figure 8:
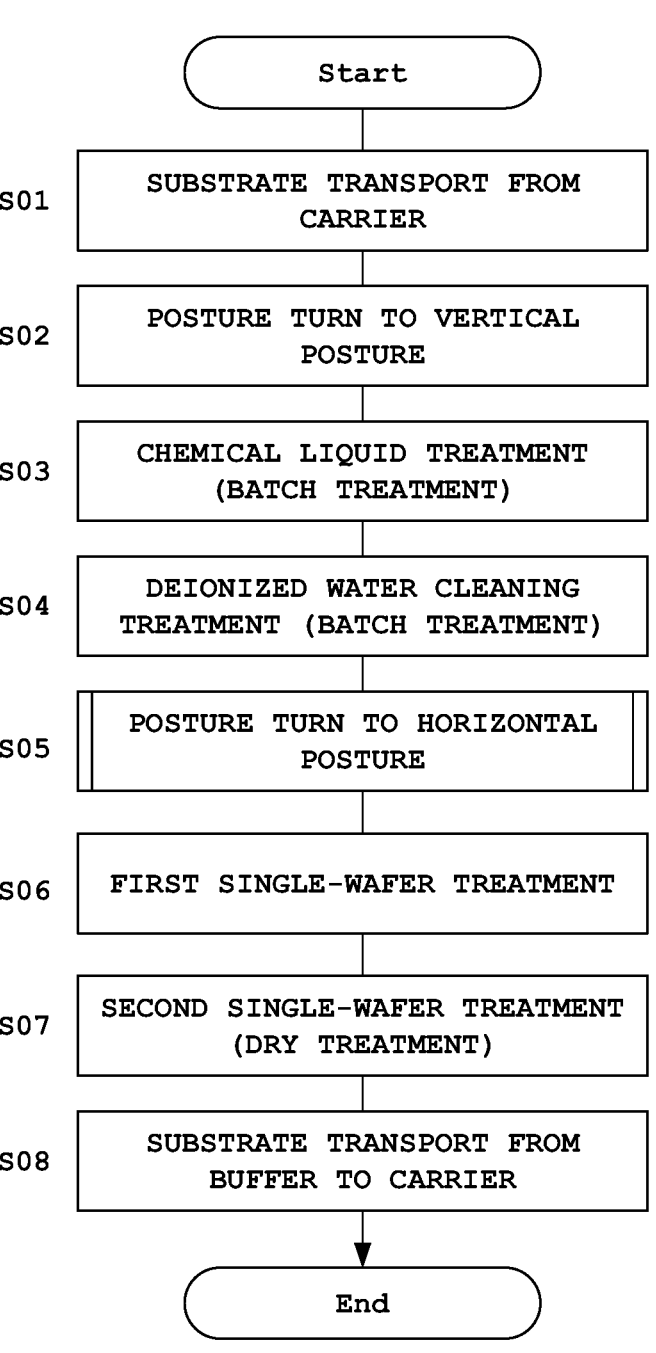
FIG. 8 is a flowchart illustrating operation of the substrate treating apparatus.
Figure 10:
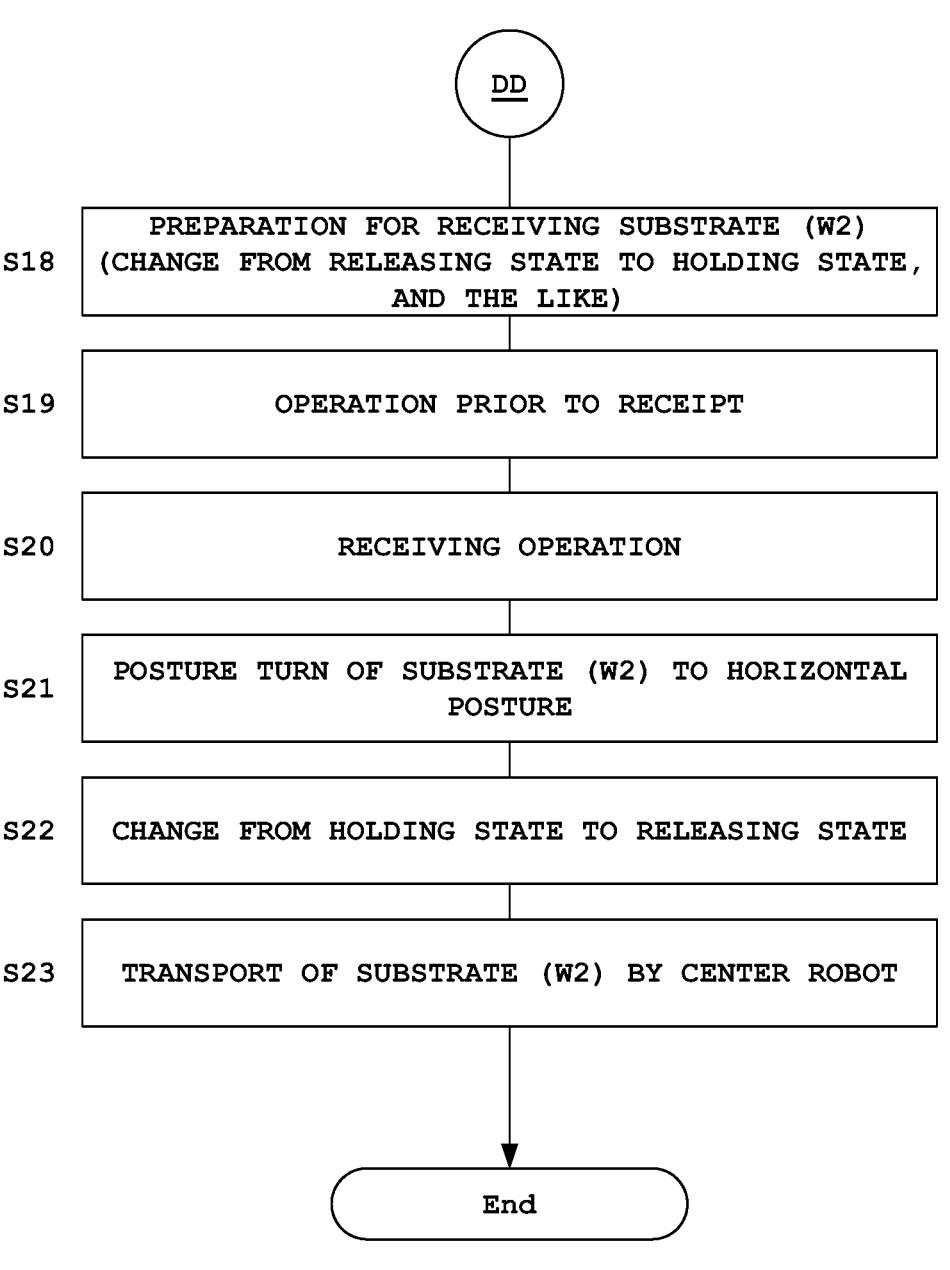
FIG. 10 is a flowchart illustrating second-half operation of the second posture turning mechanism.

The following describes operation of the substrate treating apparatus 1 with reference to flowcharts in FIGS. 8 and 10. Reference is made to FIG. 2. An external transport robot, not shown, transports two carriers C into the load port 9 in order.

[Step S01] Transportation of Substrate from Carrier

The carrier transport mechanism 11 of the stocker block 3 transports a first carrier C from the load port 9 to a shelf 13A. The substrate handling mechanism HTR of the transferring block 5 takes twenty-five substrates W1 in a horizontal posture from the first carrier C placed on the shelf 13A, and transports the substrates W1 to the posture turning unit 23. Thereafter, the carrier transport mechanism 11 transports the empty first carrier C to another shelf 13B. Then, the carrier transport mechanism 11 transports a second carrier C from the load port 9 to the shelf 13A. The substrate handling mechanism HTR takes twenty-five substrates W2 in a horizontal posture from the second carrier C placed on the shelf 13A, and transports the substrates W2 to the posture turning unit 23.

[Step S02] Posture Turn to Vertical Posture

In the posture turning unit 23, fifty substrates W (W1, W2) of two carriers C are transported. As shown in FIGS. 4A to 4F, the posture turning unit 23 and the pusher mechanism 25 cause the fifty substrates W to be aligned at a half pitch (5 mm) in a face-to-face system, and turn the posture of the fifty substrates W from horizontal to vertical. The pusher mechanism 25 transports the fifty substrates W in the vertical posture to the substrate delivery position PP determined in the transferring block 5.

[Step S03] Chemical Treatment (Batch Treatment)

The transport mechanism WTR receives the fifty substrates W in the vertical posture from the pusher mechanism 25 at the substrate delivery position PP, and transports the fifty substrates W to any of the four lifters LF1 to LF4 in the four chemical liquid process tanks BT1 to BT4, respectively.

For example, the transport mechanism WTR transports the fifty substrates W to the lifter LF1 of the chemical liquid process tank BT1. The lifter LF1 receives the fifty substrates W at a position above the chemical liquid process tank BT1. The lifter LF1 immerses the fifty substrates W in phosphoric acid as the treatment liquid within the chemical liquid process tank BT1. Accordingly, an etching treatment is performed on the fifty substrates W. After the etching treatment, the lifter LF1 pulls up the fifty substrates W from the phosphoric acid within the chemical liquid process tank BT1. It should be noted that similar treatment as in the chemical liquid process tank BT1 is performed when the fifty substrates W are transported to the other lifters LF2 to LF4 of the chemical liquid process tanks BT2 to BT4, respectively.

[Step S04] Deionized Water Cleaning Treatment (Batch Treatment)

The transport mechanism WTR receives the fifty substrates W in the vertical posture from the lifter LF1 (or lifter LF2), for example, and transports the fifty substrates W to the lifter LF5 of the water cleaning process tank BT5. The lifter LF5 receives the fifty substrates W at a position above the water cleaning process tank BT5. The lifter LF5 immerses the fifty substrates W in the deionized water within the water cleaning process tank BT5. Accordingly, a cleaning treatment is performed on the fifty substrates W.

Here, when the transport mechanism WTR receives the fifty substrates W in the vertical posture from either the lifter LF3 or LF4, the transport mechanism WTR transports the fifty substrates W to the lifter LF6 of the water cleaning process tank BT6. The lifter LF6 immerses the fifty substrates W in the deionized water within the water cleaning process tank BT6.

In this embodiment, the second posture turning mechanism 31 is provided opposite to the transferring block 5 across the six batch process tanks BT1 to BT6. The transport mechanism WTR transports a plurality of (e.g. fifty) substrates W collectively to the second posture turning mechanism 31 from the batch process tank BT1 (BT3), for example, adjacent to the transferring block 5, through the batch process tank BT5 (BT6), apart from the transferring block 5.

[Step S05] Posture Turn to Vertical Posture

The second posture turning mechanism 31 collectively turns a posture of the substrates W, on which the cleaning treatment is performed, from vertical to horizontal. Here, the following drawbacks arise. That is, if the posture of the fifty substrates W arranged at a half pitch (a pitch of 5 mm) is collectively turned, one of the hands 35 of the center robot CR may not possibly enter a gap between two adjacent substrates W of the fifty substrates W satisfactorily.

In addition, when the substrates W are aligned in a face-to-face system, the substrates W whose posture is turned to horizontal may be a substrate W whose device face is directed upward or be a substrate W whose device face is directed downward. For example, it is not suitable that the hand 35 of the center robot CR contacts the device face of the substrate W. It is also not suitable that substrates W whose directions of the device faces are different are transported to the single-wafer processing chambers SW1 to SW4.

Figure 9:
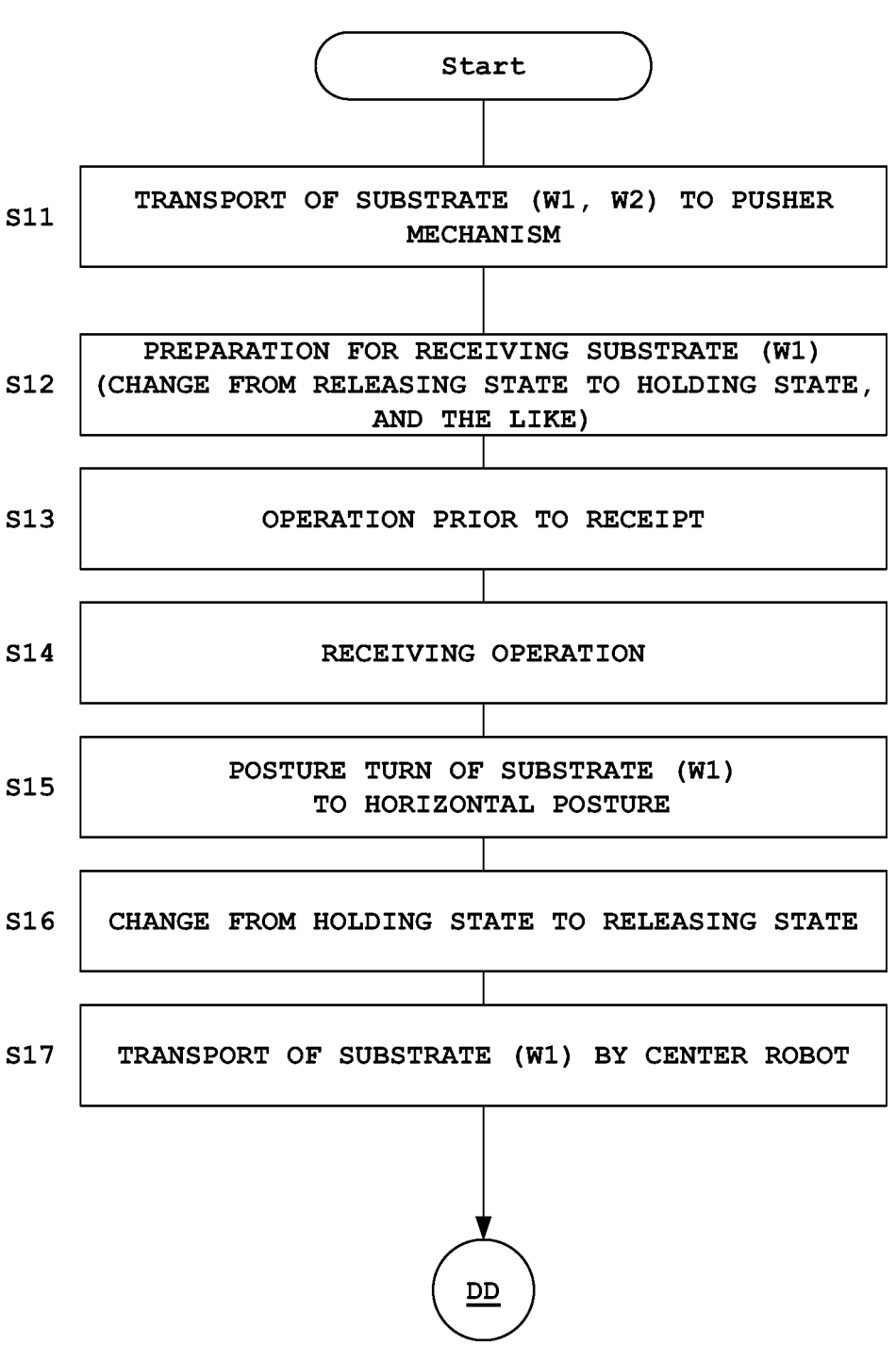
FIG. 9 is a flowchart illustrating first-half operation of the second posture turning mechanism.

Then, in this embodiment, a gap between two adjacent substrates W is widened and the device faces of the fifty substrates W face in the same direction. Moreover, the fifty substrates W are divided into the first substrate group and the second substrate group. Detailed description is made with reference to the flowchart in FIG. 9, a flow chart of FIG. 10, and FIGS. 11A to 14D.

[Step S11] Transport of Substrate to Pusher Mechanism

The transport mechanism WTR transports the fifty substrates W from either the lifter LF5 or LF6 to the pusher mechanism 61 of the second posture turning mechanism 31 (see FIG. 2). The pusher 65 of the pusher mechanism 61 holds the fifty substrates W in the vertical posture arranged in a face-to-face system and at a half pitch collectively. Moreover, the fifty substrates W are aligned in the transverse direction Y.

Here, the posture turning unit 63 is at standby in the substrate posture turning region R32 so as not to interfere with the transport mechanism WTR. Moreover, after transporting the substrates W to the pusher mechanism 61, the transport mechanism WTR moves away from above the pusher mechanism 61.

[Step S12] Preparation for Receiving Substrate (W1)

Figure 11A:
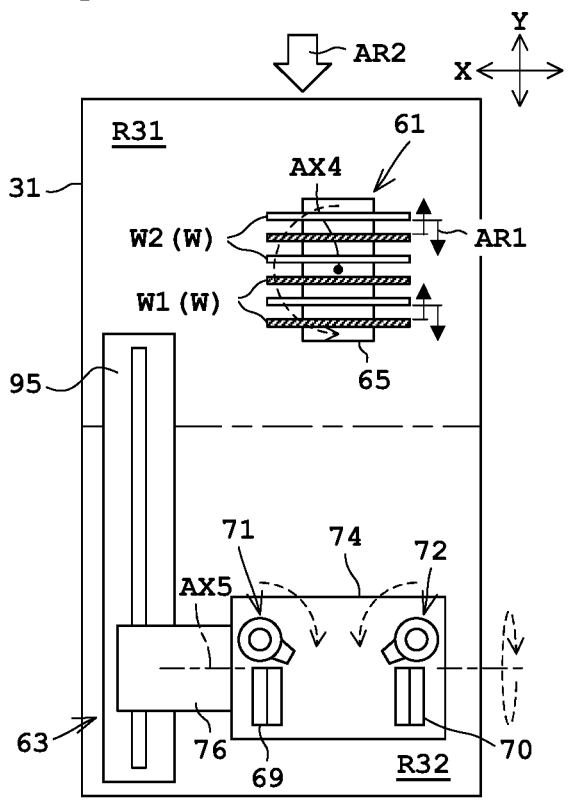
FIGS. 11A to 11D each illustrate the operation of the second posture turning mechanism.
Figure 11B:
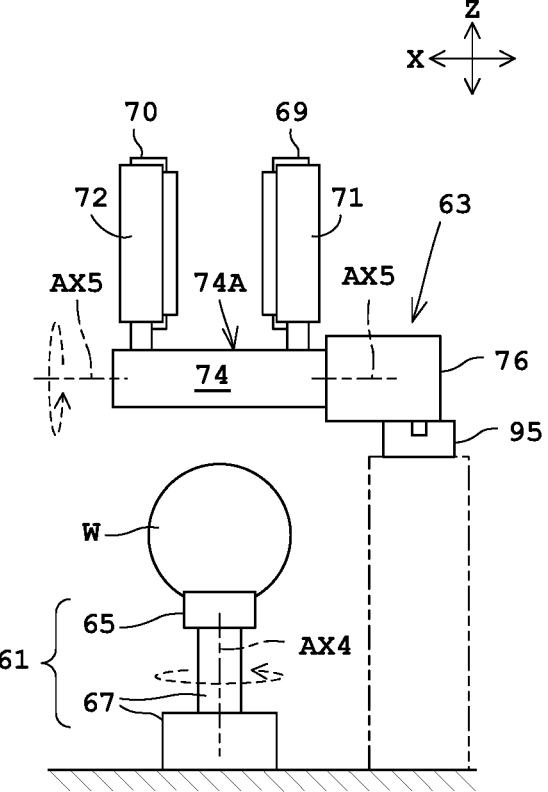

Reference is made to FIGS. 11A and 11B. The posture turning unit 63 prepares for receiving substrates W. Specifically, in order to hold the substrates W in a vertical posture, the support base rotator 76 rotates the support base 74 and the like around the horizontal axis AX5 by 90 degrees leftward Y such that the two horizontal holders 69, 70 and the two vertical holders 71, 72 extend leftward Y (toward pusher mechanism 61). Moreover, the rotation driving unit 78 rotates the two holder bodies 84, 86 around the two rotating members 83, 85 (central axes AX7, AX8), respectively, whereby the two vertical holders 71, 72 are changed into the holding state.

Moreover, the lifting and rotating portion 67 of the pusher mechanism 61 rotates the pusher 65, holding the fifty substrates W in the vertical posture, around the vertical axis AX4. Accordingly, as shown in FIG. 11A, the device faces of the substrates W1 in the first substrate group are directed leftward Y (toward opposite to the support base 74). Consequently, the device faces can be directed upward when a posture of the twenty-five substrates W1 is turned to horizontal. It should be noted that the step S12 is performable in a next step S13.

[Step S13] Operation Prior to Receipt

When the posture turning unit 63 receives the twenty-five substrates W1 (the first substrate group) from the pusher 65, the horizontally moving portion 95 and the lifting and rotating portion 67 are brought into a pre-received state where the two vertical holders 71, 72 are arranged below the pusher 65.

Figure 11C:
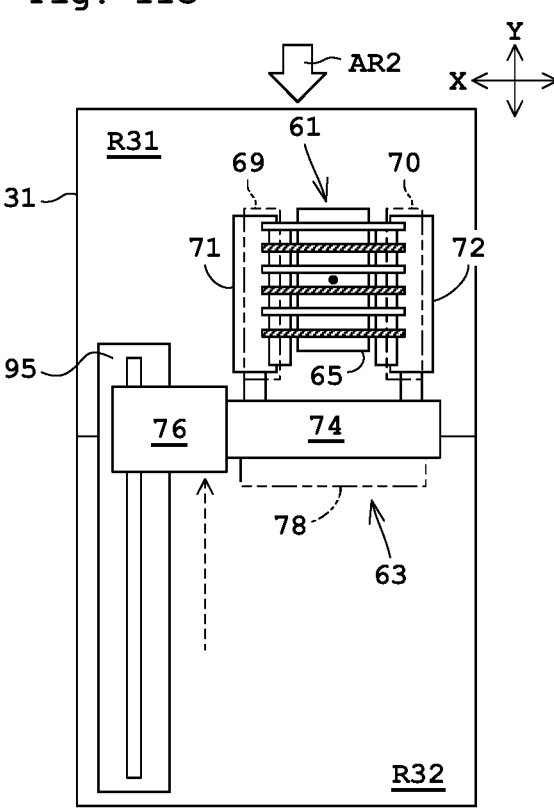
Figure 11D:
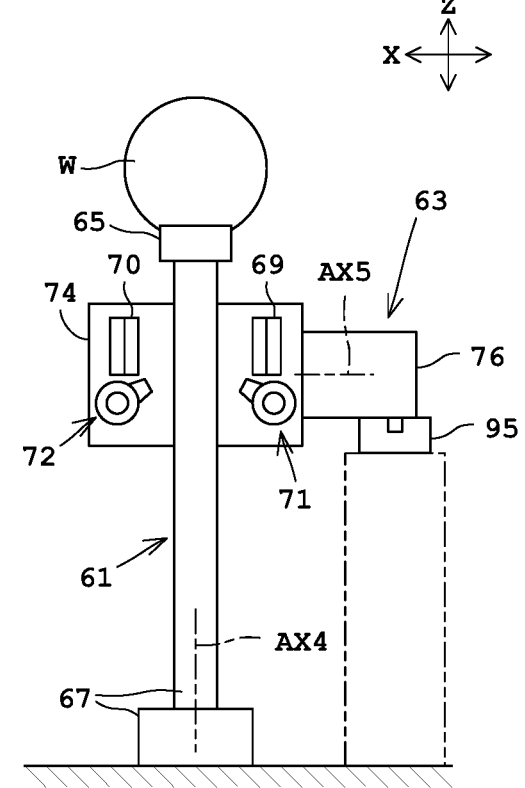

Detailed description is as under. Reference is made to FIGS. 11C and 11D. The lifting and rotating portion 67 of the pusher mechanism 61 moves the pusher 65, supporting the fifty substrates W in the vertical posture, to an upper position higher than the two vertical holders 71, 72 and the two horizontal holders 69, 70. Thereafter, the horizontally moving portion 95 moves the two vertical holders 71, 72 and the two horizontal holders 69, 70 below the pusher 65 while moving the two vertical holders 71, 72 and the like from the substrate posture turning region R32 to the substrate stand-by region R31. This brings the pusher 65 and the two vertical holders 71, 72 into the pre-received state.

[Step S14] Receiving Operation

Figure 12A:
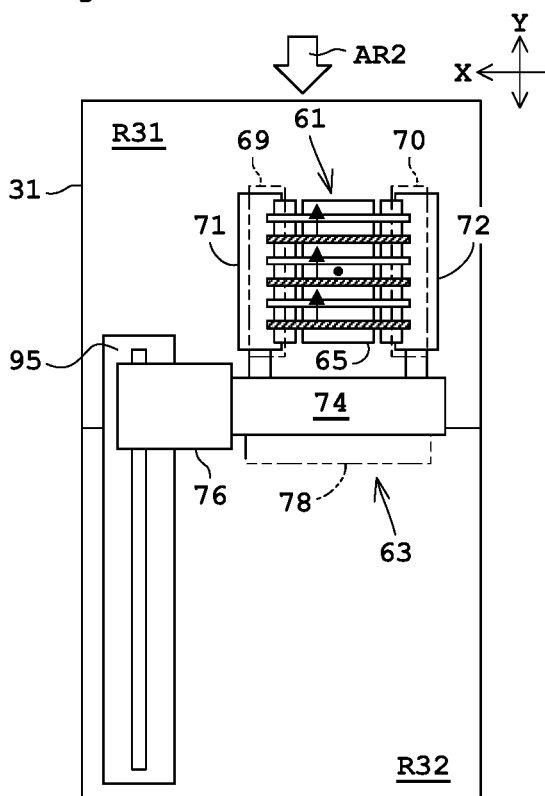
FIGS. 12A to 12D each illustrate the operation of the second posture turning mechanism.
Figure 12B:
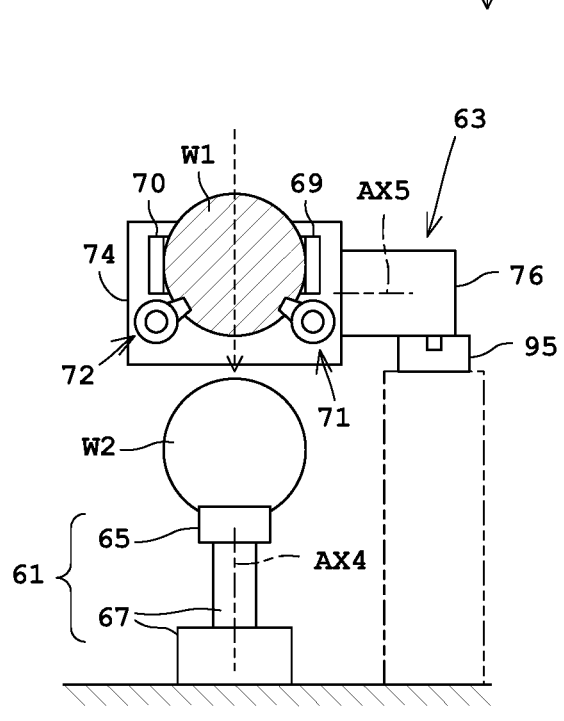

Reference is made to FIGS. 12A and 12B. Then, the lifting and rotating portion 67 moves the pusher 65 downward to the standby position. When the pusher 65 passes between the two vertical holders 71, 72, the fifty substrates W are housed by the two horizontal holders 69, 70, while being housed in the twenty-five-paired holding grooves 89, 90 and twenty-five-paired passing grooves 91, 92 of the two vertical holders 71, 72, respectively. Then, the two vertical holders 71, 72 receive the first substrate group (twenty-five substrates W1) of the fifty substrates W in the twenty-five-paired holding grooves 89, 90 from the pusher 65. In contrast to this, the second substrate group (twenty-five substrates W2) housed in the twenty-five-paired passing grooves 91, 92 remain on the pusher 65.

Here, the twenty-five substrates W1 taken out one out of two are arranged at a full pitch. The residual twenty-five substrates W2 on the pusher 65 are also arranged at a full pitch. The residual twenty-five substrates W2 on the pusher 65 are at a stand-by state. Here, the first substrate group correspond to the first divided substrate group in the present invention. Moreover, the second substrate group is called the second divided substrate group in the present invention.

[Step S15] Posture Turn of Substrate (W1) to Horizontal Posture

Figure 12C:
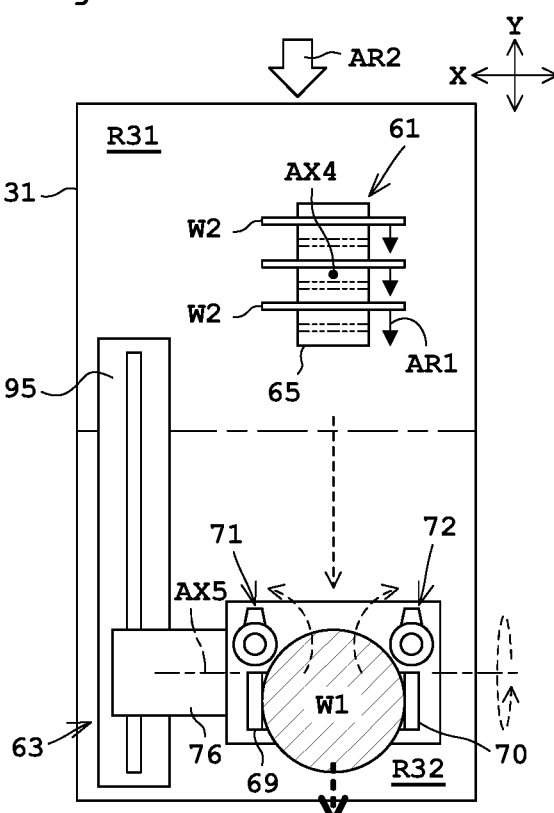
Figure 12D:
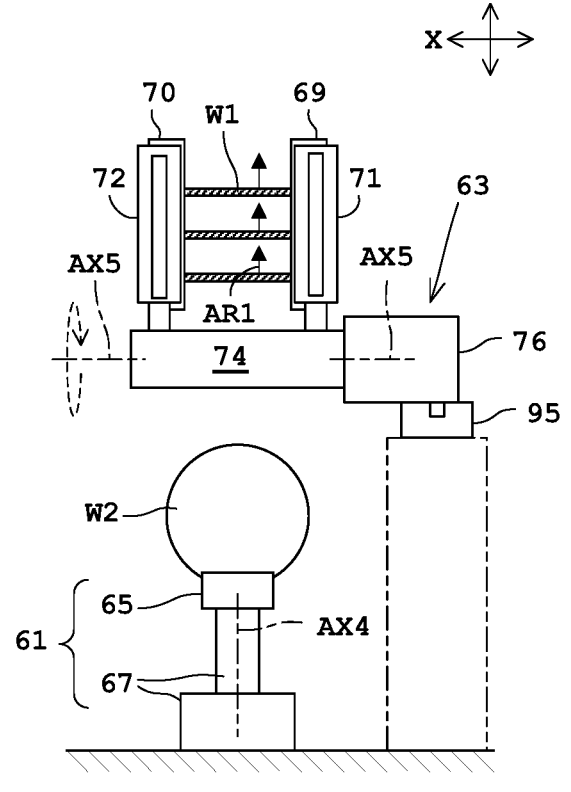

Reference is made to FIGS. 12C and 12D. Thereafter, the horizontally moving portion 95 moves the two vertical holders 71, 72 and the like from the substrate stand-by region R31 to a predetermined position in the substrate posture turning region R32. Then, the support base rotator 76 rotates the support base 74 and the like around the horizontal axis AX5 by 90 degrees rightward Y. This turns a posture of the first substrate group (twenty-five substrates W1) held by the two vertical holders 71, 72 from vertical to horizontal.

[Step S16] Change from Holding State to Releasing State

Then, the rotation driving unit 78 rotates the two holder bodies 84, 86 around the two rotating members 83, 85 (central axes AX7, AX8), respectively, whereby the two vertical holders 71, 72 are changed from the holding state into the releasing state. Accordingly, the two holder bodies 84, 86 are separated from the first substrate group. Moreover, the first substrate group is taken out of the twenty-five-paired holding grooves 89, 90 of the two vertical holders 71, 72 (see FIG. 7).

The twenty-five-paired holding grooves 89, 90 are each formed in a V-shape. Accordingly, such a case is assumed, for example, that one substrate W in a horizontal posture is placed on the one-paired horizontal guides 79, 80, and held in the one-paired holding grooves 89, 90. The one substrate W in the horizontal posture is restricted in the up-down direction by the one-paired V-shaped holding grooves 89, 90. Consequently, when the center robot CR lifts the substrate W, a load is applied to the substrate W. Then, restriction by the one-paired holding grooves 89, 90 is released, whereby the center robot CR can transport the substrate W in the horizontal posture satisfactorily.

[Step S17] Transport of Substrate (W1) by Center Robot

Then, the center robot CR transports the twenty-five substrates W1 (first substrate group) each placed on each pair of the twenty-five-paired horizontal guides 79, 80 of the two horizontal holders 69, 70 one by one to either the single-wafer processing chamber SW1 or SW2. Moreover, the center robot CR transports the substrates W1 while lifting up the substrates W1 each placed on each pair of the paired horizontal guides 79, 80 one by one.

The following describes steps S18 to S23. Here, the same parts as those in the steps S12 to S17 are to be described briefly.

[Step S18] Preparation for Receiving Substrate (W2)

Figure 13A:
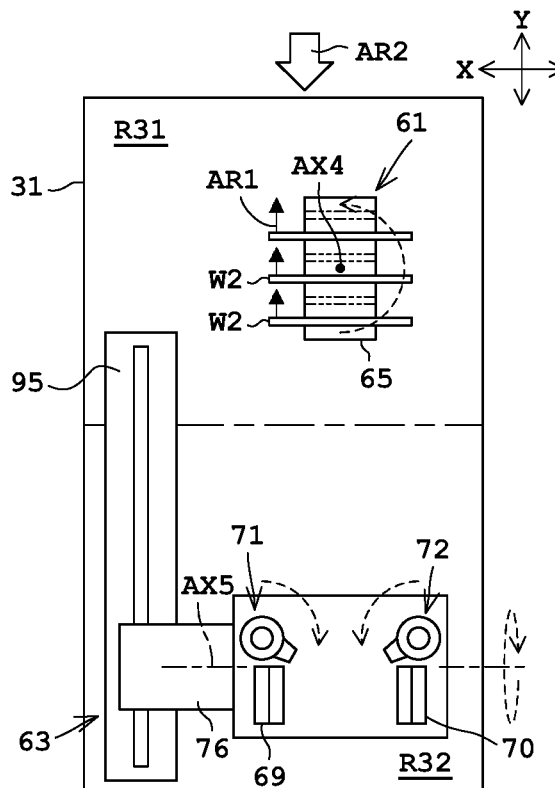
FIGS. 13A to 13D each illustrate the operation of the second posture turning mechanism.
Figure 13B:
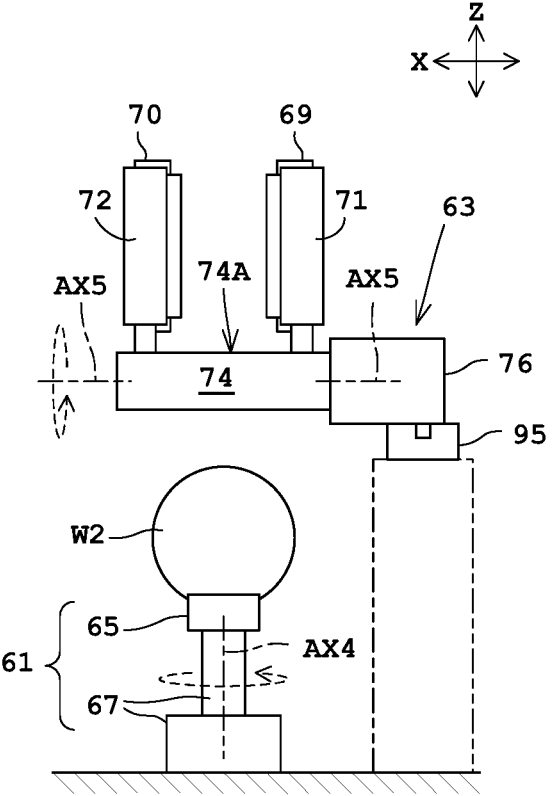

Reference is made to FIGS. 13A and 13B. The posture turning unit 63 prepares for receiving the twenty-five substrates W2 in the second substrate group. Specifically, the support base rotator 76 rotates the support base 74 and the like around the horizontal axis AX5 by 90 degrees leftward Y such that the two vertical holders 71, 72 and the like extend leftward Y (toward pusher mechanism 61). Moreover, the rotation driving unit 78 rotates the two holder bodies 84, 86 around the two rotating members 83, 85 (central axes AX7, AX8), respectively, whereby the two vertical holders 71, 72 are changed into the holding state.

Moreover, the lifting and rotating portion 67 of the pusher mechanism 61 rotates the pusher 65, holding the twenty-five substrates W2 (second substrate group) in the vertical posture, by 180 degrees around the vertical axis AX4. Consequently, the device faces can be directed upward when a posture of the twenty-five substrates W2 is turned to horizontal. Moreover, 180-degree rotation can cause the twenty-five-paired holding grooves 89, 90 to hold the twenty-five substrates W2 at a position in the transverse direction Y where the twenty-five-paired holding grooves 89, 90 hold the first substrate group.

[Step S19] Operation Prior to Receipt

Figure 13C:
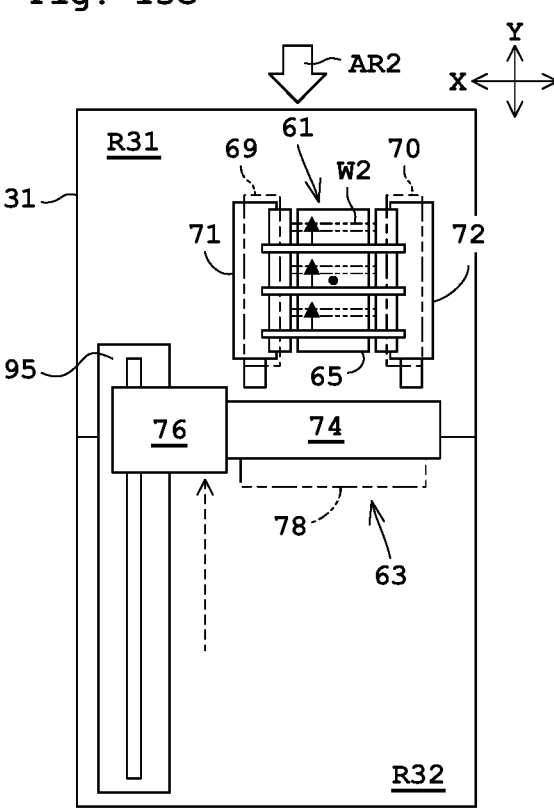
Figure 13D:
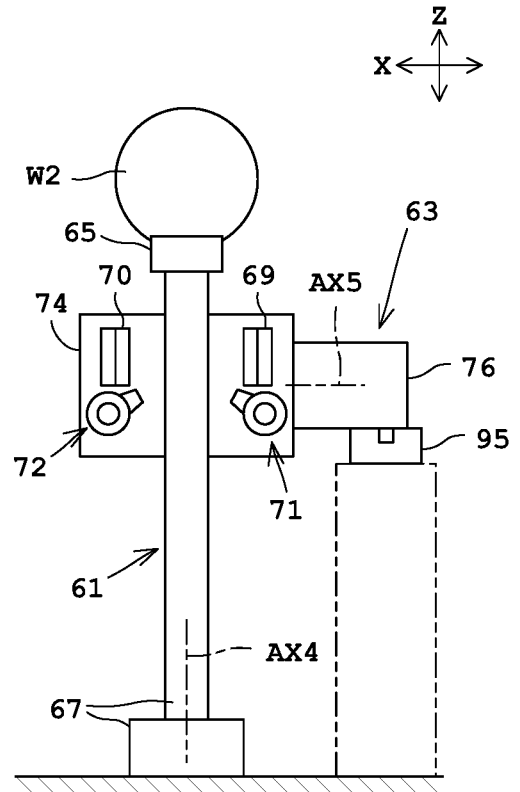

Reference is made to FIGS. 13C and 13D. The lifting and rotating portion 67 moves the pusher 65, supporting the twenty-five substrates W2 in the vertical posture, to an upper position higher than the two vertical holders 71, 72 and the two horizontal holders 69, 70. Thereafter, the horizontally moving portion 95 moves the two vertical holders 71, 72 and the like below the pusher 65. This brings the pusher 65 and the two vertical holders 71, 72 into the pre-received state.

[Step S20] Receiving Operation

Figure 14A:
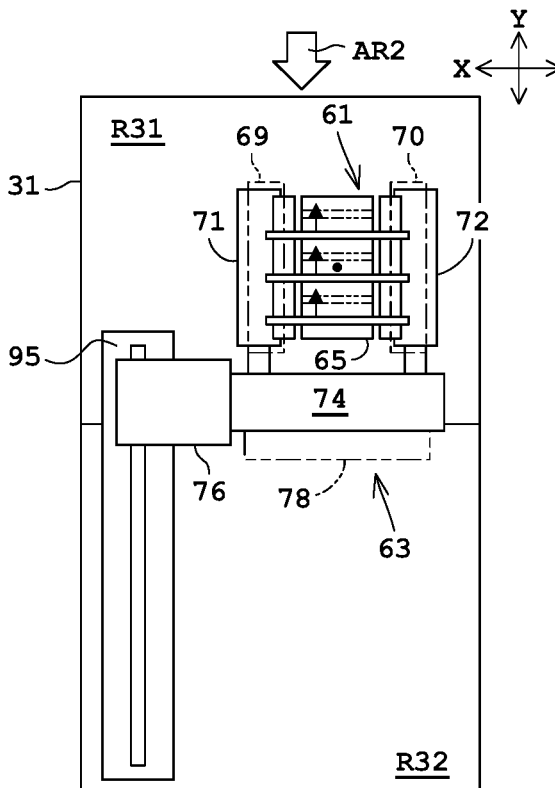
FIGS. 14A to 14D each illustrate the operation of the second posture turning mechanism.
Figure 14B:
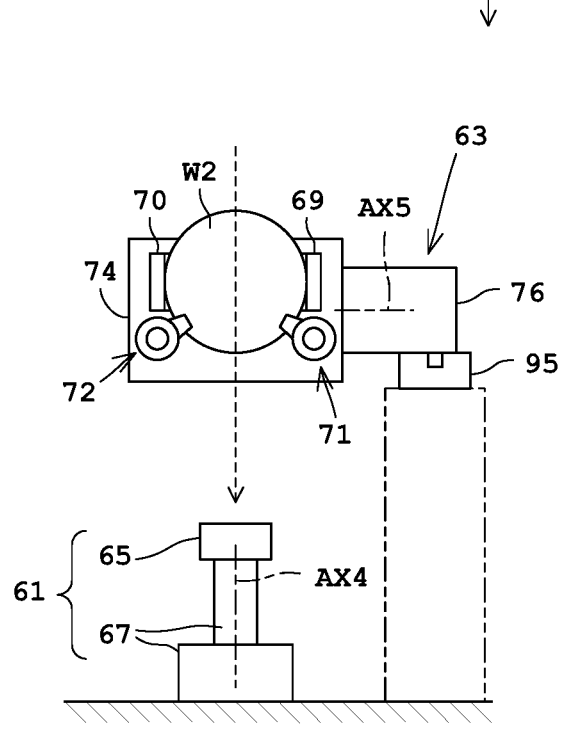

Reference is made to FIGS. 14A and 14B. Then, the lifting and rotating portion 67 moves the pusher 65 downward to the standby position. When the pusher 65 passes between the two vertical holders 71, 72, the twenty-five substrates W2 are housed by the two horizontal holders 69, 70, while being housed in the twenty-five-paired holding grooves 89, 90 individually. Then, the two vertical holders 71, 72 receive the second substrate group (twenty-five substrates W2) with the twenty-five-paired holding grooves 89, 90 from the pusher 65.

[Step S21] Posture Turn of Substrate (W2) to Vertical Posture

Figure 14C:
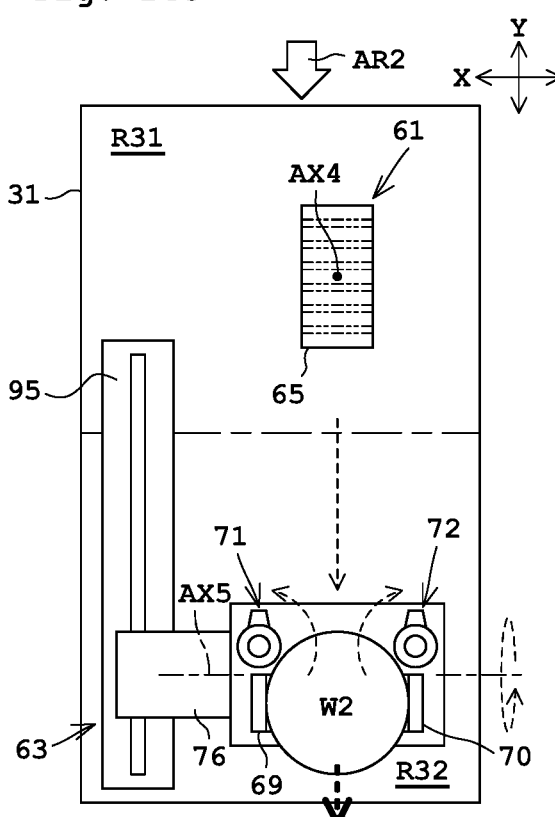
Figure 14D:
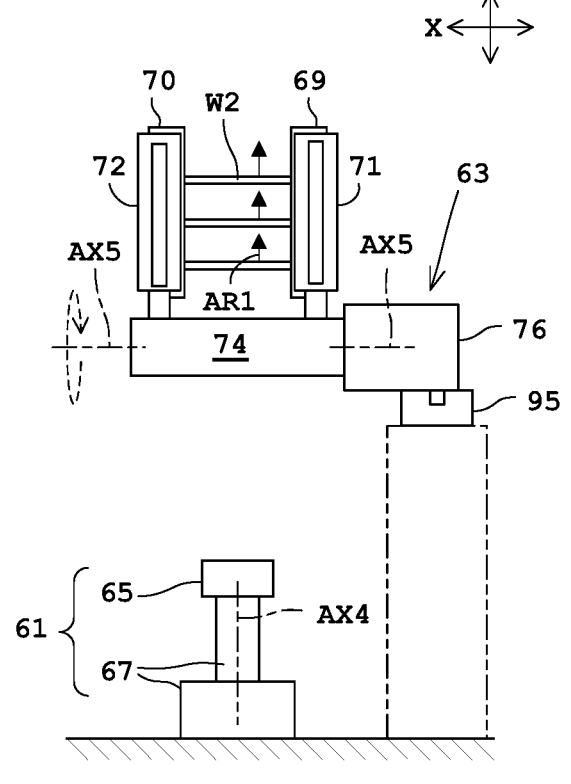

Reference is made to FIGS. 14C and 14D. Thereafter, the horizontally moving portion 95 moves the two vertical holders 71, 72 and the like from the substrate stand-by region R31 to a predetermined position in the substrate posture turning region R32. Then, the support base rotator 76 rotates the support base 74 and the like around the horizontal axis AX5 by 90 degrees rightward Y. This turns a posture of the second substrate group (twenty-five substrates W2) held by the two vertical holders 71, 72 from vertical to horizontal.

[Step S22] Change from Holding State to Releasing State

Then, the rotation driving unit 78 rotates the two holder bodies 84, 86 around the two rotating members 83, 85 (central axes AX7, AX8), respectively, whereby the two vertical holders 71, 72 are changed from the holding state into the releasing state. Accordingly, the two holder bodies 84, 86 are separated from the second substrate group. Moreover, the second substrate group is taken out of the twenty-five-paired holding grooves 89, 90 of the two vertical holders 71, 72.

[Step S23] Transportation of Substrate (W2) by Center Robot

Then, the center robot CR transports the twenty-five substrates W2 (second substrate group), each placed on each pair of the twenty-five-paired horizontal guides 79, 80, one by one to either the single-wafer processing chamber SW1 or SW2.

[Step S06] First Single-Wafer Treatment

Description returns to the flowchart in FIG. 8. For example, the center robot CR transports the substrates W (W1, W2) from the posture turning unit 63 to the first single-wafer processing chamber SW1. The first single-wafer processing chamber SW1 supplies deionized water from the nozzle 47 to device faces of the substrates W while the rotating unit 45 rotates the substrates W whose device faces are directed upward. Then, the first single-wafer processing chamber SW1 supplies IPA from the nozzle 47 to the device faces (top faces) of the substrates W to replace the deionized water on the substrates W with the IPA.

[Step S07] Second Single-Wafer Treatment (Dry Treatment)

Thereafter, the center robot CR takes the substrates W, wet with the IPA, from first single-wafer processing chamber SW1 (SW2), and transports the substrates W to either the single-wafer processing chamber SW3 or SW4. The single-wafer processing chambers SW3, SW4 each perform dry treatment on the substrates W with carbon dioxide under a supercritical state (supercritical fluid). Such dry treatment with the supercritical fluid can suppress pattern collapse of the device faces of the substrates W.

[Step S08] Substrate Transportation from Buffer Unit to Carrier

The center robot CR transports the substrates W, on which the dry treatment is performed, from either the single-wafer processing chamber SW3 or SW4 to any mount shelf of the buffer unit 33. When the substrates W1 in one lot (twenty-five) are transported into the buffer unit 33, the substrate handling mechanism HTR collectively transports the twenty-five substrates W1 from the buffer unit 33 into an empty first carrier C placed on the shelf 13A. Then, the carrier transport mechanism 11 in the stocker block 3 transports the first carrier C to the load port 9.

Moreover, when the substrates W2 in one lot are transported into the buffer unit 33, the substrate handling mechanism HTR collectively transports the twenty-five substrates W2 from the buffer unit 33 into an empty second carrier C placed on the shelf 13A. Then, the transport mechanism 11 of the stocker block 3 transports the second carrier C to the load port 9. An external transport robot, not shown, transports the two carriers C into a next destination in order.

With this embodiment, when the posture of the substrates W, held by the two vertical holders 71, 72, are turned from vertical to horizontal by the support base rotator 76, the rotation driving unit 78 changes the state of the two vertical holders 71, 72 into the releasing state, whereby the substrates W are released from the first holder body 84 and the second holder body 86. Here, since the releasing state is brought by rotating the two holder bodies 84, 86, a force applied to the substrates W when release is made, which may cause positional shift of the substrates W, is offset with the two holder bodies 84, 86. For example, as shown by arrows AR5 and AR6 in FIG. 7, a force exerting in a right-and-left direction (front-back direction X) is offset. This leads to difficulty in generation of the positional shift of the substrates W. Consequently, the two vertical holders 71, 72 can release holding of the substrates W satisfactorily.

Moreover, in order to bring the two vertical holders 71, 72 into either the holding state or the releasing state, the two holder bodies 84, 86 rotate individually. Thus, the support base 74, i.e., the posture turning unit 63 can be made compact.

Moreover, the first rotating member 83 and the second rotating member 85 are arranged by a width WD smaller than a diameter of each of the substrates W. Even when the position of the substrates W, held by the holding grooves 89, 90, is shifted when the two holder bodies 84, 86 having the holding grooves 89, 90, respectively, rotate for being brought into the releasing state, the first rotating member 83 and the second rotating member 85 serve as a stopper. This achieves further prevention of the positional shift of the substrates W.

Moreover, the two holder bodies 84, 86 each further include the passing grooves 91, 92, respectively, provided in the direction where the substrates W are aligned and configured to pass the substrates W one by one. The holding grooves 89 and the passing grooves 91 as well as the holding grooves 90 and the passing grooves 92 are arranged alternately for holding the first substrate group (substrates W1), made by taking every other substrate out of the substrates W, with use of the holding grooves 89, 90. The posture turning unit 63 receives the first substrate group (substrates W1) of the substrates W from the pusher 65, and turns a posture of the received first substrate group from vertical to horizontal.

The two vertical holders 71, 72 hold the first substrate group (substrates W1) made by taking every other substrate out of the substrates W, achieving a widened pitch between two adjacent substrates W. Accordingly, the center robot CR can take the substrates W from the posture turning unit 63 easily.

Moreover, the pusher mechanism 61 includes the lifting and rotating portion 67 configured to move the pusher 65 in the vertical direction Z relative to the two vertical holders 71, 72 of the posture turning unit 63. The posture turning unit 63 includes the horizontally moving portion 95 configured to move the two vertical holders 71, 72 and the like horizontally relative to the pusher 65. When the posture turning unit 63 receives the substrates W from the pusher 65, the lifting and rotating portion 67 and the horizontally moving portion 95 are brought into the pre-received state where the two vertical holders 71, 72 are arranged below the pusher 65. The two vertical holders 71, 72 are changed from the pre-received state to the received state where the two vertical holders 71, 72 are arranged above the pusher 65, whereby the lifting and rotating portion 67 causes the two vertical holders 71, 72 to receive the substrates W in the vertical posture held by the pusher 65. The support base rotator 76 rotates the support base 74 around the horizontal axis AX5, whereby the posture of the substrates W held by the two vertical holders 71, 72 is turned from vertical to horizontal.

The pusher 65 and the two vertical holders 71, 72 are moved relatively horizontally, and are moved relatively vertically, whereby the posture turning unit 63 can receive the substrates W from the pusher 65.

The holding grooves 89, 90 are each formed in a V-shape such that a width thereof in a thickness direction of the substrates W is narrower toward its depth. Accordingly, the substrates W in a vertical posture can be held with the holding grooves 89, 90. Here, it is assumed that the two vertical holders 71, 72 keep holding substrates W after the posture of the substrates W are turned to horizontal. In this case, since the substrates W are restricted, load is applied to the substrates W when the substrates W are to be moved upward and transported. With the aspect of the present invention, however, the two vertical holders 71, 72 are brought into the releasing state, whereby the substrates W are released from the two holder bodies 84, 86. This can prevent load application to the substrates W.

Moreover, in order to bring the two vertical holders 71, 72 into the releasing state, the rotation driving unit 78 rotates the two holder bodies 84, 86 around the two rotating members 83, 85, respectively, from a state where the substrates W are gripped with the two holder bodies 84, 86 toward a direction apart from the two horizontal holders 69, 70. This can release the substrates W from the two holder bodies 84, 86 while the two rotating members 83, 85 prevent positional shift of the substrates W.

Second Embodiment

Figures 15A, 15B:
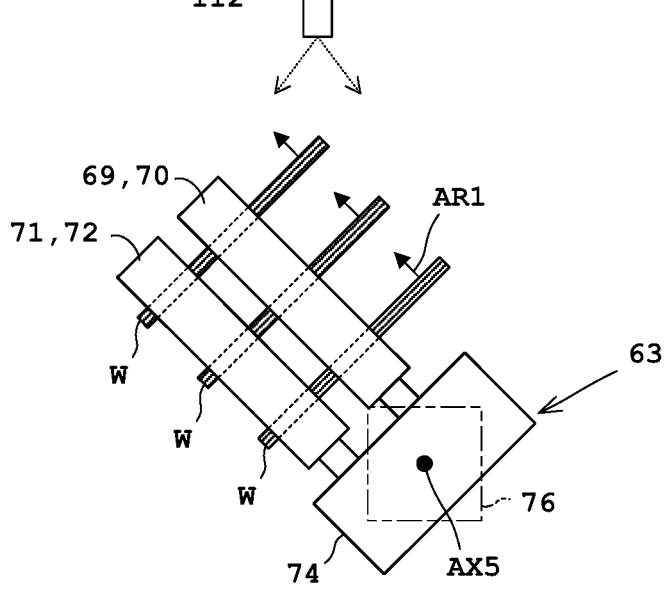
FIG. 15A is a longitudinal sectional view of a pusher mechanism of a second posture turning mechanism according to a second embodiment.
FIG. 15B is a side view of a posture turning unit of the second posture turning mechanism according to the second embodiment.

The following describes a second embodiment of the present invention with reference to the drawings. Here, the description common to that of the first embodiment is to be omitted. FIG. 15A is a longitudinal sectional view of a pusher mechanism 61 of a second posture turning mechanism 31 according to a second embodiment. FIG. 15B is a plan view of a posture turning unit 63 of the second posture turning mechanism 31 according to the second embodiment.

Reference is made to FIG. 15A. The pusher mechanism 61 in the second embodiment includes a stand-by tank 107 for storing a liquid and two jet pipes 109 for supplying deionized water (DIW) as the liquid, for example, to the stand-by tank 107 in order to immerse substrates W held by a pusher 65 in the liquid when the pusher 65 moves downward. The jet pipe 109 is configured to extend linearly in the front-back direction X or transverse direction Y. The jet pipe 109 has a plurality of jet ports 109A (holder nozzles) extending along the jet pipe 109. The jet ports 109A each ejects deionized water. The stand-by tank 107 stores deionized water ejected from the jet pipes 109.

As shown in FIGS. 12C, 12D, for example, when the posture turning unit 63 turns a posture of the substrates W1, the substrates W2 at a stand-by state are immersed in the deionized water within the stand-by tank 107, leading to prevention of drying the substrates W2.

Note that the stand-by tank 107 does not necessarily store deionized water. In this case, the jet ports 109A of the jet pipe 109 may supply deionized water in a shower state or a mist state to the substrates W held by the pusher 65. In addition, as shown in dotted lines in FIG. 15A, the jet ports 109A (jet pipe 109) may be located at a position higher than the substrates W. When the deionized water in a shower state or a mist state is supplied to the substrates W, the stand-by tank 107 may or may not be provided.

Reference is next made to FIG. 15B. The second posture turning mechanism 31 includes a posture turning nozzle 112. The nozzle 112 supplies deionized water (DIW) as a liquid in a shower state or a mist state to the substrates W held by the vertical holders 71, 72 of the posture turning unit 63. The nozzle 112 is provided at a position higher than the substrates W. Moreover, the nozzle 112 may be movable so as not to interfere with the posture turning unit 63.

For example, the support base rotator 76 turns a posture of the substrates W, held by the vertical holders 71, 72, to either vertical or oblique. In this condition, the nozzle 112 supplies deionized water in a shower state or a mist state to the substrates W held by the vertical holders 71, 72. Here, the oblique posture is a posture where device faces of the substrates are directed upward.

For example, when the center robot CR suspends transportation of the substrates W, drying the substrates W held by the posture turning units 63 can be prevented. Moreover, if the posture of the substrates W is horizontal in supplying the deionized water, the deionized water in a shower state or a mist state is hard to spread over the device faces. However, the posture of the substrates W is turned to either vertical or oblique where the device faces are directed upward, leading to easy spread of the deionized water in a shower state or a mist state over the device faces.

Moreover, the substrate treating apparatus 1 may adopt both the construction in FIG. 15A and the construction in FIG. 15B. Alternatively, the substrate treating apparatus 1 may adopt either the construction in FIG. 15A or the construction in FIG. 15B.

If the substrates W are dried before the dry treatment in the single-wafer processing chambers SW3, SW4, pattern collapse of the substrates W occurs. However, this embodiment can prevent drying of the substrates W held by the pusher 65. Moreover, this embodiment can prevent drying of the substrates W held by the two vertical holders 71, 72 of the posture turning unit 63.

The present invention is not limited to the foregoing examples, but may be modified as follows.

(1) In the embodiments described above, the lifting and rotating portion 67 moves the pusher 65, supporting the twenty-five substrates W2 in the vertical posture, to the upper position higher than the two vertical holders 71, 72 and the like, and thereafter, the horizontally moving portion 95 moves the two vertical holders 71, 72 and the like below the pusher 65. In this regard, the pusher 65, the two vertical holders 71, 72, and the like may be moved relatively horizontally. Moreover, the pusher 65, the two vertical holders 71, 72, and the like may be moved relatively vertically in the vertical direction Z.

Figure 16A:
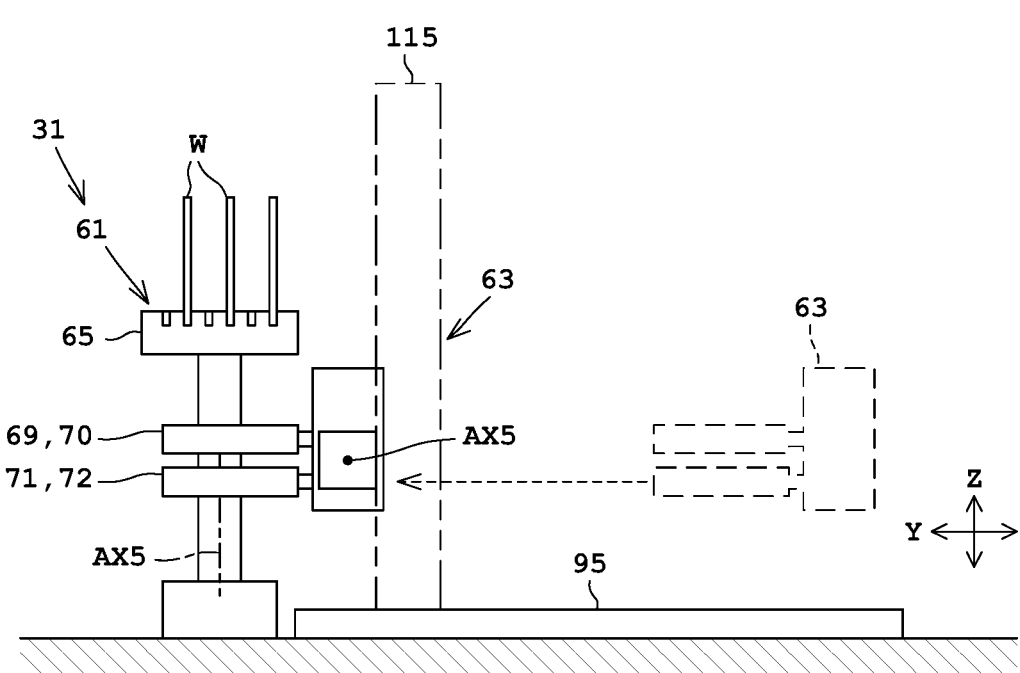
FIGS. 16A and 16B illustrate a second posture turning mechanism according to one modification.
Figure 16B:
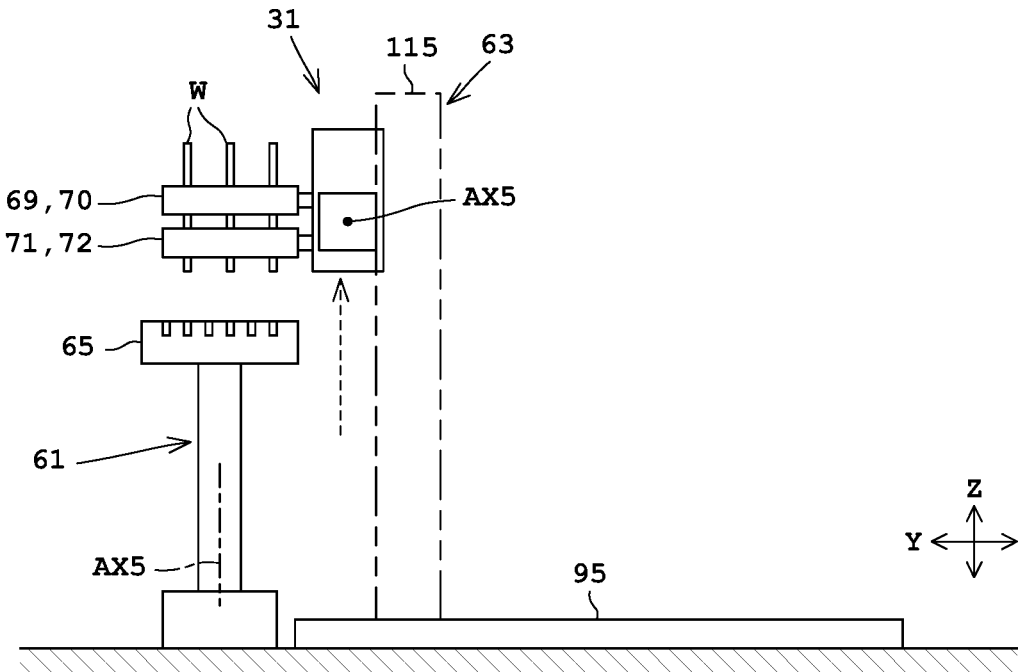

As shown in FIG. 16A, the posture turning unit 63 may include the horizontally moving portion 95 and a lifting member 115. In this case, the horizontally moving portion 95 moves the two vertical holders 71, 72, the lifting member 115, and the like in the transverse direction Y, thereby moving the two vertical holders 71, 72 and the like below the pusher 65 (pre-received state). Then, as shown in FIG. 16B, the lifting member 115 moves the vertical holders 71, 72 and the like upward in the vertical direction Z, thereby receiving the substrates W held by the pusher 65 (received state).

Figure 17A:
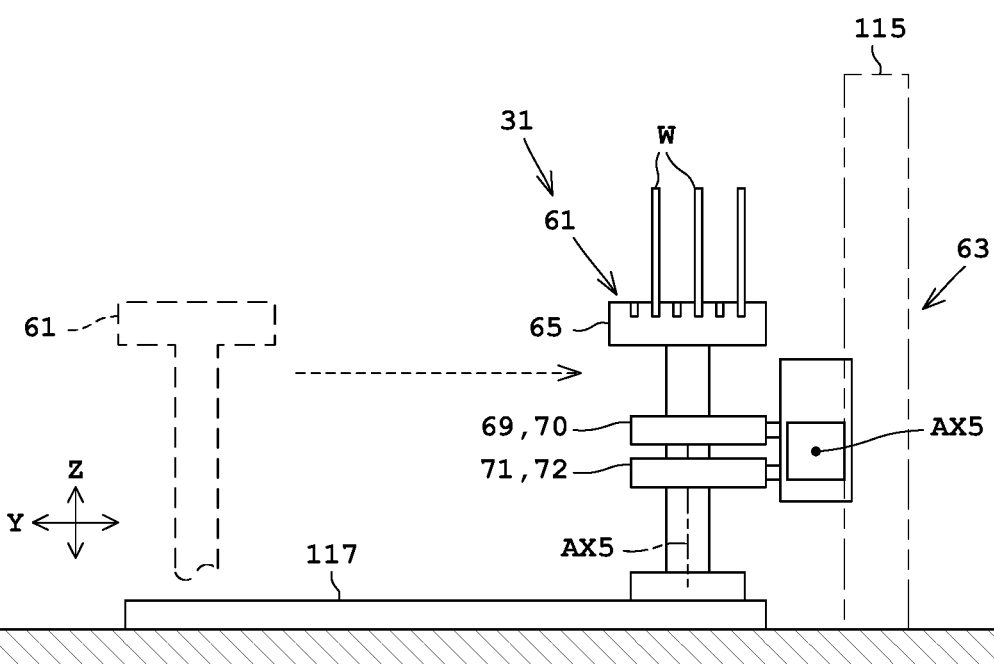
FIGS. 17A and 17B illustrate a second posture turning mechanism according to another modification.
Figure 17B:
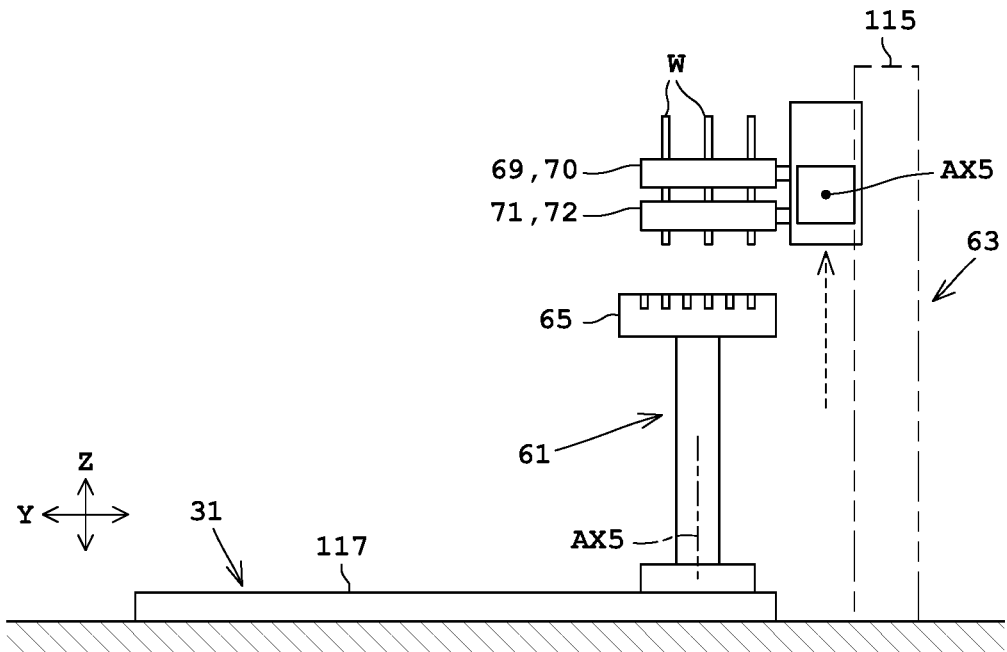

Moreover, as shown in FIG. 17A, the pusher mechanism 61 may include a horizontally moving portion 117, and the posture turning unit 63 may include a lifting member 115. In this case, the horizontally moving portion 117 moves the pusher 65 in the transverse direction Y, thereby moving the pusher 65 above the vertical holders 71, 72 (pre-received state). Then, as shown in FIG. 17B, the lifting member 115 moves the two vertical holders 71, 72 and the like upward in the vertical direction Z, thereby receiving the substrates W held by the pusher 65 (received state).

Figure 18A:
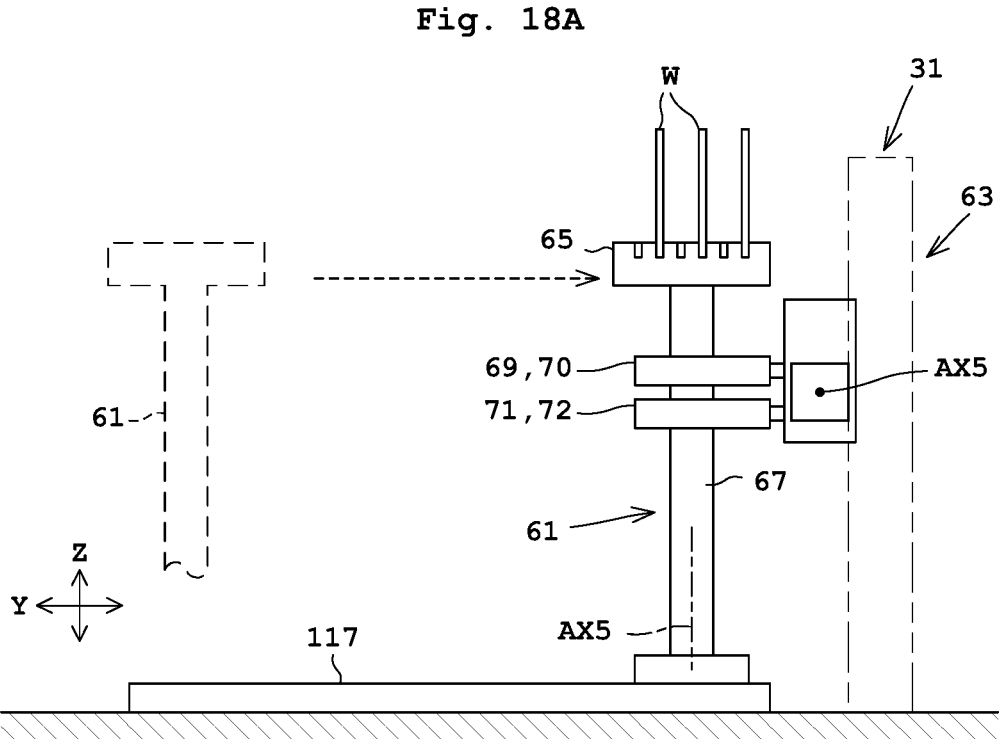
FIGS. 18A and 18B illustrate a second posture turning mechanism according to another modification.
Figure 18B:
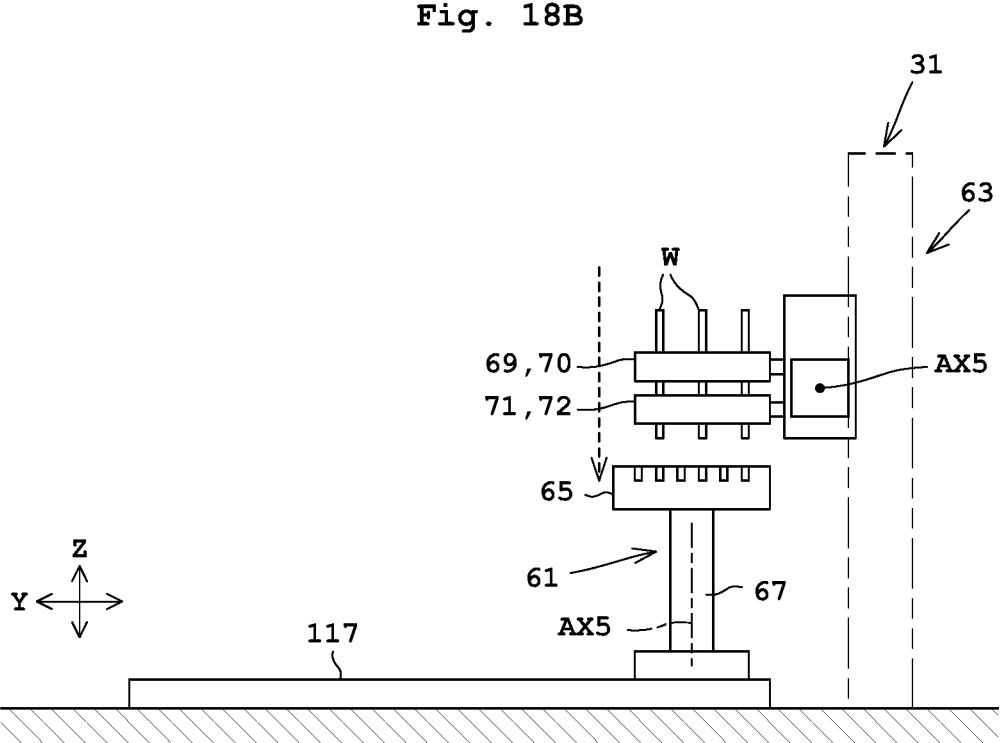

Moreover, as shown in FIG. 18A, the pusher mechanism 61 may include a horizontally moving portion 117 and a lifting and rotating portion 67. In this case, the horizontally moving portion 117 moves the pusher 65 in the transverse direction Y, thereby moving the pusher 65 above the vertical holders 71, 72 (pre-received state). Then, as shown in FIG. 18B, the lifting and rotating portion 67 moves the pusher 65 downward in the vertical direction Z, whereby the vertical holders 71, 72 receive the substrates W held by the pusher 65 (received state).

Moreover, the pusher mechanism 61 may include a horizontally moving portion 117 and a lifting and rotating portion 67, and the posture turning unit 63 may include a horizontally moving portion 95 and a lifting member 115. The lifting member 115 and the horizontally moving portion 117 each include an electric motor. The horizontally moving portion 117 corresponds to the relative moving unit in the present invention. The lifting member 115 corresponds to the relative lifting member in the present invention.

(2) In the embodiments and the modification described above, the single-wafer processing chambers SW3, SW4 perform the dry treatment on the substrates W with the supercritical fluid. In this regard, the single-wafer processing chambers SW3, SW4 may include a rotating unit 45 and a nozzle 47 like the single-wafer processing chambers SW1, SW2. In this case, the single-wafer processing chambers SW1 to SW4 each supply deionized water and IPA, for example, to substrates W in this order, and then perform dry treatment (spin drying) on the substrates W.

(3) In the embodiments and the modifications described above, the batch process tanks BT1 to BT6 each perform treatment on the fifty substrates W arranged in a face-to-face system and at a half pitch. However, the batch process tanks BT1 to BT6 may each perform treatment on substrates W arranged in a face-to-back system where device faces of the substrates W are all directed to the same direction. The batch process tanks BT1 to BT6 may each perform treatment on twenty-five substrates W for one carrier C arranged at a full pitch. When fifty substrates W are arranged in the face-to-back system in FIG. 11A, the horizontally moving portion 95 moves the two vertical holders 71, 72 in the transverse direction Y where the substrates W are aligned, thereby pulling out twenty-five substrates W1 or twenty-five substrates W2.

(4) In the embodiments described above, the first posture turning mechanism turns a posture of the substrates W from horizontal to vertical. In this regard, the first posture turning mechanism 15 may have the same construction as that of the second posture turning mechanism 31.

(5) In the embodiments described above, the two rotating members 83, 85 are arranged by a width WD smaller than a diameter of each of the substrates W. In this regard, the two rotating members 83, 85 may be arranged by a width WD larger than a diameter of each of the substrates Was necessarily.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for successively performing batch treatment for processing a plurality of substrates collectively and single-wafer treatment for processing the substrates one by one, the substrate treating apparatus comprising:

a batch process tank configured to perform treatment on the plurality of substrates collectively;

a batch substrate transport mechanism configured to transport the substrates in a vertical posture collectively to the batch process tank;

a single-wafer processing chamber configured to perform treatment on the substrates one by one;

a horizontal substrate transport mechanism configured to transport the substrates in a horizontal posture one by one to the single-wafer processing chamber; and a posture turning mechanism configured to turn a posture of the substrates, on which the batch treatment is performed, from vertical to horizontal, the posture turning mechanism including:

a substrate holder configured to hold the substrates in the vertical posture that are arranged at a predetermined pitch; and a posture turning unit configured to receive the substrates from the substrate holder and turn a posture of the received substrates from vertical to horizontal, the posture turning unit including:

two horizontal holder configured to house the substrates and place thereon when the substrates are in the horizontal posture;

two vertical holders configured to hold the substrates, housed by the two horizontal holders, in the vertical posture when the substrates are in the vertical posture;

a support base configured to support the two horizontal holders and the two vertical holders;

a support base rotator configured to rotate the support base around a horizontal axis; and a state changing unit configured to change a state of the two vertical holders between a holding state where the two vertical holders can hold the substrates and a releasing state where the two vertical holders release the holding state, the two vertical holders being constituted by a first vertical holder and a second vertical holder, the first vertical holder including:

a first rotating member extending perpendicular with respect to a support face of the support base; and a first holder body provided so as to protrude from the first rotating member in a direction orthogonal to an extension direction where the first rotating member extends, the second vertical holder including:

a second rotating member extending perpendicular with respect to the support face of the support base; and a second holder body provided so as to protrude from the second rotating member in a direction orthogonal to an extension direction where the second rotating member extends, the first holder body and the second holder body each having a plurality of holding grooves provided along an alignment direction where the substrates are aligned, the state changing unit changing a state of the two vertical holder to either the holding state or the releasing state by causing the first holder body and the second holder body to rotate around the first rotating member and the second rotating member, respectively, when the substrates are to be held, the state changing unit changing the state of the two vertical holders into the holding state, whereby the first holder body and the second holder body grip the substrates, and when a posture of the substrates, held by the two vertical holders, is turned from vertical to horizontal by the support base rotator, the state changing unit changing the state of the two vertical holders into the releasing state, whereby the first holder body and the second holder body release the substrates.

2. The substrate treating apparatus according to claim 1, wherein the first rotating member and the second rotating member are arranged by a width smaller than a diameter of each of the substrates.

3. The substrate treating apparatus according to claim 1, further comprising:

a lateral rotator configured to rotate the substrate holder around a vertical axis.

4. The substrate treating apparatus according to claim 1, wherein the first holder body and the second holder body each further include a plurality of passing grooves provided in the alignment direction of the substrates and configured to pass the substrates one by one, the holding grooves and the passing grooves are arranged alternately for holding a first divided substrate group, made by taking every other substrate out of the substrates, with the holding grooves, and the posture turning unit receives the first divided substrate group of the substrates from the substrate holder, and turns a posture of the first divided substrate group from vertical to horizontal.

5. The substrate treating apparatus according to claim 1, further comprising:

a relative moving unit configured to move the substrate holder and the two vertical holders relatively horizontally; and a relative lifting member configured to move the substrate holder and the two vertical holders relatively vertically, wherein when the posture turning unit receives the substrates from the substrate holder, the relative moving unit and the relative lifting member are brought into a pre-received state where the two vertical holders are arranged below the substrate holder, the relative lifting member is brought from the pre-received state to a received state where the two vertical holders are arranged above the substrate holder, whereby the two vertical holders receive the substrates in a vertical posture held by the substrate holder, and the support base rotator rotates the support base around the horizontal axis, whereby a posture of the substrates held by the two vertical holders is turned from vertical to horizontal.

6. The substrate treating apparatus according to claim 1, further comprising:

a stand-by tank configured to store a liquid in which the substrates held by the substrate holder are immersed.

7. The substrate treating apparatus according to claim 1, wherein the holding grooves are each formed in a V shape such that a width thereof in a thickness direction of the substrates is narrower toward its depth.

8. The substrate treating apparatus according to claim 2, wherein the state changing unit causes the first holder body and the second holder body in a state where the first holder body and the second holder body grip the substrates to rotate around the first rotating member and the second rotating member, respectively, toward a direction apart from the two horizontal holders in order to bring the two vertical holders into the releasing state.

9. The substrate treating apparatus according to claim 1, further comprising:

a controller, wherein the controller is configured to:

cause the state changing unit to change a state of the two vertical holders to either the holding state or the releasing state by causing the first holder body and the second holder body to rotate around the first rotating member and the second rotating member, respectively;

cause the state changing unit to change the state of the two vertical holders into the holding state when the substrates are to be held, whereby the first holder body and the second holder body grip the substrates; and cause the state changing unit to change the state of the two vertical holders into the releasing state when a posture of the substrates, held by the two vertical holders, is turned from vertical to horizontal by the support base rotator, whereby the first holder body and the second holder body release the substrates.

10. The substrate treating apparatus according to claim 9, wherein the controller is configured to cause the state changing unit to rotate the first holder body and the second holder body, in a state where the first holder body and the second holder body grip the substrates, around the first rotating member and the second rotating member, respectively, toward a direction apart from the two horizontal holders in order to bring the two vertical holders into the releasing state.

* * * * *